(12) United States Patent
Athanasas et al.

(10) Patent No.: US 11,807,129 B2
(45) Date of Patent: Nov. 7, 2023

(54) ELECTROMOBILITY CHARGE TEST SYSTEM AND ELECTROMOBILITY CHARGE TEST METHOD

(71) Applicant: COMEMSO IMMOBILIEN GMBH & CO. KG., Ostfildern (DE)

(72) Inventors: Kiriakos Athanasas, Ostfildern (DE); Anita Athanasas, Ostfildern (DE)

(73) Assignee: COMEMSO IMMOBILIEN GMBH & CO. KG, Ostfildern (DE)

( * ) Notice: Subject to any disclaimer, the term of this patent is extended or adjusted under 35 U.S.C. 154(b) by 0 days.

(21) Appl. No.: 18/022,333

(22) PCT Filed: Aug. 19, 2021

(86) PCT No.: PCT/EP2021/073032
§ 371 (c)(1),
(2) Date: Feb. 21, 2023

(87) PCT Pub. No.: WO2022/038225
PCT Pub. Date: Feb. 24, 2022

(65) Prior Publication Data
US 2023/0286407 A1    Sep. 14, 2023

(30) Foreign Application Priority Data
Aug. 21, 2020  (DE) .......................... 102020121988.1

(51) Int. Cl.
*B60L 53/66*    (2019.01)
*B60L 53/62*    (2019.01)
*B60L 53/10*    (2019.01)

(52) U.S. Cl.
CPC .............. *B60L 53/66* (2019.02); *B60L 53/11* (2019.02); *B60L 53/62* (2019.02); *B60L 2260/44* (2013.01)

(58) Field of Classification Search
CPC ....................................................... B60L 53/66
(Continued)

(56) References Cited

U.S. PATENT DOCUMENTS

| 2006/0089733 | A1 | 4/2006 | Dickinson et al. |
| 2012/0116745 | A1 | 5/2012 | Dickinson et al. |

(Continued)

FOREIGN PATENT DOCUMENTS

| DE | 202012100613 U1 | 6/2012 |
| DE | 102014205924 A1 | 10/2015 |

(Continued)

OTHER PUBLICATIONS

Herbst, Daniel et al., Concept and prototype for checking the protective measures against electric shock of DC charging stations for electric vehicles, Symposium Energieinnovation, Graz, Austria, Conference of Feb. 14, 2018, 16 pages.

(Continued)

*Primary Examiner* — Jerry D Robbins
(74) *Attorney, Agent, or Firm* — DINSMORE & SHOHL LLP

(57) ABSTRACT

An electromobility charge testing system and a charge testing method for generating and exchanging measurement data and/or a charging model of a charging operation of an electric vehicle and/or charging station, and for testing the communication capability and/or chargeability, includes: at least one measuring device for providing the measurement data of the charging operation of the electric vehicle and/or charging station, wherein the measurement data is subdividable into action data and reaction data; at least one modeling device for creating a charging model of the charging operation; at least one server device for storage and provision of an exchange possibility for the measurement data and/or charging model; and at least one emulation device for (Continued)

downloading the measurement data and/or the charging model by playing back the selected measurement data subdividable into action data and reaction data and/or the correspondingly generated charging model.

21 Claims, 24 Drawing Sheets

(58) Field of Classification Search
USPC .......................................................... 320/109
See application file for complete search history.

(56) References Cited

U.S. PATENT DOCUMENTS

| | | | |
|---|---|---|---|
| 2013/0346010 A1* | 12/2013 | Schulz | .................... B60L 53/14 |
| | | | 324/602 |
| 2013/0346025 A1 | 12/2013 | Schulz | |
| 2014/0225620 A1 | 8/2014 | Campbell et al. | |
| 2015/0346288 A1 | 12/2015 | Hardy et al. | |
| 2016/0144728 A1* | 5/2016 | Harper | .................... B60L 53/67 |
| | | | 320/109 |
| 2019/0255963 A1* | 8/2019 | Goei | ........................ B60L 53/68 |
| 2022/0111747 A1* | 4/2022 | Goei | ........................ B60L 53/66 |

FOREIGN PATENT DOCUMENTS

| | | |
|---|---|---|
| DE | 102015114527 A1 | 3/2016 |
| DE | 102017214071 A1 | 2/2019 |
| EP | 2498363 A1 | 9/2012 |
| WO | 03081538 A2 | 10/2003 |
| WO | 2004043088 A2 | 5/2004 |
| WO | 2014169927 A1 | 10/2014 |

OTHER PUBLICATIONS

Popov, A., et al., Power hardware-in-the-loop test bench for tests and verification of EV and EVSE charging systems, 8 pages.
Bohn, T., et al., National Electric Transportation Infrastructure Working Council, EVSE Testing Tool Options In: EPRI IWC Meeting, Day Two Presentations, Electric Power Research Institute, Inc, Oct. 26, 2017, p. 2-20, https://www.epri.com/pages/sa/infrastructure-working.council [download of Apr. 27, 2021].

* cited by examiner

ELECTROMOBILITY CHARGE TEST SYSTEM AND ELECTROMOBILITY CHARGE TEST METHOD

CROSS-REFERENCE TO RELATED APPLICATIONS

This application is the U.S. National Stage of PCT/EP2021/073032 filed on Aug. 19, 2021, which claims priority to German Patent Application 102020121988.1 filed on Aug. 21, 2020, the entire content of both are incorporated herein by reference in their entirety.

FIELD OF THE INVENTION

The present invention relates to an electromobility charge testing system for generating and exchanging measurement data and/or charging models of electrical behaviors, in particular voltage and/or current behaviors, protocol parameters and communication contents of a charging operation of an electric vehicle and/or charging station, and for testing the communication capability of the electric vehicle and/or charging station. The invention further relates to an electromobility charge testing method.

BACKGROUND OF THE INVENTION

In the field of electromobility, there are very many charging station manufacturers and electric vehicle manufacturers worldwide, for whom it is not possible to perform a 100% interoperability test with one another on a regular basis due to a large number of variants and versions. Interoperability is the capability of different systems to work together as seamlessly as possible.

Electrical recording devices or testing devices are known, using which a specific electric vehicle or a specific charging station can be tested according to a standard, or to test a specific charging station or electric vehicle in respect of interoperability between these specific components. The recording device can further be used for measuring, analyzing and recording between a charging station and an electric vehicle. The data logged by means of the recording device can be saved in a database and administered by a user. By means of this data, the user can simulate some electrical behaviors between the electric vehicle and the charging station, or test a charging process of an electric vehicle or simulate an electric vehicle at a laboratory testing area with a simulated charging station, in order to test a specific charging station with this electrical behavior.

A generic system and method of this type for modeling or simulating an application environment, in order to analyze the behavior of a particular battery and charger inside the electric vehicle in the application environment, is described for example in WO 2004/073088 A2. An analysis device can be used for receiving data logged by a data recording unit during a real charging operation. The analysis device can analyze the data in order to determine an energy transfer profile. Furthermore, the data can be uploaded to cloud storage in the internet and downloaded by other users to permit analysis of the specific charging operation.

DE 10 2014 205 924 A1 discloses a storage unit for vehicle data recording. A battery controller with a software is provided in the storage unit. The software permits logging and analysis of measurement data, wherein the measurement data can be battery-relevant data, vehicle data, traction battery data or environmental data. This measurement data is recorded during a driving cycle of an electric vehicle. The driving cycle measurement data can be uploaded to an internet server by a mobile terminal via an internet interface, allowing this data to be entered into databases and made available to vehicle manufacturers or battery suppliers.

DE 10 2015 114 527 A1 describes a system for testing of DC quick charging for electric vehicles. The testing system comprises a DC quick charging tester and can perform a simulation of a charging process. This allows a failed charging event of the electric vehicle to be diagnosed.

Furthermore, a test plug for charging stations of electric vehicles is known from DE 20 2012 100 613 U1. The test plug comprises a control module for simulating the function of the electric vehicle connected to the charging station.

DE 10 2017 214 071 A1 describes a method for charging an electric vehicle, wherein charge control of a charging station and of the electric vehicle is performed by a higher-level computer center.

US 2015/0346288 A1 describes a device for testing a charging station for an electric vehicle, in particular for measuring the energy supplied to the electric vehicle by the charging station. The device can conduct testing in an active or in a passive mode. In the passive mode, a real electric vehicle is connected to the charging station. Interactions between the electric vehicle and the charging station are monitored by the device, and parameters can be measured. In the active mode, a load and protocols are connected to the device for emulating a load provided by the electric vehicle to be tested, wherein the load can be designed as a programmable load. The load can be integrated into the device or attachable thereto as a resistive load or electronic load. Based on US 2015/0346288 A1, the load is already preconfigured, in particular by programming prior to testing, and is designed to emulate the electric vehicle. During a testing process, only the measurements are conducted and the data to be measured is recorded by the device.

US 2013/0346025 A1 also shows an electric vehicle charging station testing system, the testing system comprising a load module. The load module can emulate a load of an electric vehicle. The load module is equipped with a variable load, wherein a resistance and other load properties of the load module can be tested by a controller. As a result, an electric vehicle battery system and other unexpected behavior such as a faulty electric vehicle battery can be emulated. The testing system is also purely a recording and measuring system, with a load module preconfigured before testing being arranged to emulate the electric vehicle battery system.

US 2012/0116745 A1 shows a device used for simulating and testing a charging station for electric vehicles. The device is equipped with resistance loads for simulating the loads of the electric vehicles.

Furthermore, the article "Konzept and Prototyp zur Überprüfung der Schutzmaβnahmen gegen elektrischen Schlag von DC-Ladestationen für Elektrofahrzeuge" by Herbst, D., Schmautzer, E., Schürhuber, R., Jauk, B., Unterweger, M., & Wolf, C., 15th Symposium on Energy Innovation, Graz, Austria, Conference of Feb. 14, 2018 through Dec. 16, 2018, DOI 10.3217/978-3-85125-586-7, present a tester unit for testing protective measures against electric shocks from DC charging stations for electric vehicles, the tester unit comprising an electronic load for simulating a battery of the electric vehicle and communication in conjunction with this.

Also, the article "Power hardware-in-the-loop test bench for tests and verification of EV and EVSE charging systems" by A. Popov, M. Tybel and M. Schugt, 2014 IEEE International Electric Vehicle Conference (IEVC), 2014, pp. 1-8. DOI: 10.1109/IEVC.2014.7056139, likewise shows a general testing device for electric vehicles and charging stations. Electric vehicles can be emulated by the device.

The document "NATIONAL ELECTRIC TRANSPORTATION INFRASTRUCTURE WORKING COUNCIL" by Theodore Bohn, EVSE Testing Tool Options In: EPRI IWC Meeting, Day Two Presentations, Electric Power Research Institute, Inc, Oct. 26, 2017, pages 2-20, https://www.epri.com/pages/sa/infrastructure-working.council [downloaded on Apr. 27, 2021], describes a testing device for testing charging stations, this device being configured with an electric vehicle emulator. The testing device permits testing of the charging station without actual electric vehicles. How precisely this testing device is designed and operates cannot be clearly ascertained from the document.

With the known recording/testing devices, the problem arises that every electric vehicle manufacturer or charging station manufacturer records specific charging operations of individual electric vehicles or charging stations by means of a special recording/testing device, where however a measurement data record as complete as possible of various electric vehicles is needed for the charging station manufacturer, and of various charging stations for the electric vehicle manufacturer. The recorded measurement data cannot be automatically used for playing back. The measurement data has to be manually extracted and manually preconfigured during an emulation, in order to perform automated simulations of the charging stations or electric vehicles. Since the market is rapidly changing, the electric vehicle manufacturers must be tested with a high number of charging stations, and the charging station manufacturers with a high number of electric vehicles, to reliably ensure interoperability and thus to address changes in the market.

Based on the above prior art, the object of the invention is to propose an electromobility charge testing system and a corresponding electromobility charge testing method, using which measurement data and/or charging models of electrical behaviors from a number of different charging station types or electric vehicle types are generated and exchanged, and hence the communication capability/interoperability of a specific type of electric vehicle and/or charging station can be tested.

The object is achieved by an electromobility charge testing system having the features disclosed herein and by an electromobility charge testing method having the features disclosed herein. Advantageous further developments of the invention are also disclosed.

SUMMARY OF THE INVENTION

In accordance with the invention, an electromobility charge testing system is proposed for generating and exchanging measurement data and/or charging models of electrical behaviors, in particular voltage and/or current behaviors, protocol parameters and communication contents of a charging operation of an electric vehicle and/or charging station, and for testing the communication capability and/or chargeability of the electric vehicle and/or charging station. The electromobility charge testing system comprises at least one measuring device for providing the measurement data of the electrical behaviors, protocol parameters and/or communication contents of the charging operation of the electric vehicle and/or charging station, wherein the measurement data is subdividable into action data and reaction data; at least one modeling device for modeling the charging operation, wherein a charging model for action and reaction is automatically generatable based on the measurement data logged by the measuring device; at least one server device for storing and providing an exchange possibility for the measurement data and/or charging models, such that the measurement data and/or charging models are uploadable to the server device directly or via a network and/or are downloadable from the server device; and at least one emulation device for downloading the measurement data and/or charging models from the measuring device and/or modeling device and/or server device and for emulating the charging operation of the charging station and/or electric vehicle by playing back the measurement data subdividable into action data and reaction data and/or correspondingly generated charging models.

The electromobility charge testing system in accordance with the invention enables the charging operation of the electric vehicle and/or charging station to be measured and recorded by the measuring device, such that the electrical behaviors, in particular voltage and/or current behaviors during the charging operation, the protocol parameters and the communication contents of the charging operation, in particular signal values and signal quality, are provided. It is furthermore possible with the measuring device to measure varying behaviors between the electric vehicle and the charging station. Based on the measurement data, the charging operation of the electric vehicle and/or charging station is emulated by the modeling device. The charging models can be generated here automatically, semi-automatically or manually from the measurement data, wherein a test of the charging behavior on the basis of charging models can be referred to as reactive modeling that is based on a database-based model of action and reaction. Charging models can, when the measurement data is incomplete, be supplemented by manually generated data to obtain a complete charging model, wherein there should be an option to distinguish and identify real measurement data and manually generated data. Based on the recorded measurement data, charging models of charging operations can be generated automatically by both the electric vehicle and the charging station.

In addition, the measurement data can be subdivided into action data and reaction data, and hence corresponding charging models for action and reaction generated automatically. This serves to achieve a more realistic representation of the charging model, since charging between the electric vehicle and the charging station consists of action and reaction. As soon as the electric vehicle is connected to the charging station, the action data can be tested in accordance with the action of the electric vehicle to be tested. This determines whether an identical or similar action can be performed. The reaction data adapting to the action can thus be selected, and the corresponding reactions of the charging station for the vehicle to be tested are played back in order to simulate the charging station as a charging model. This permits the most realistic possible imitation of a charging operation on the part of both the electric vehicle and the charging station. The emulated electric vehicle and charging station receive the same data and energy inflows and perform comparable operations, achieving as far as possible the same result as real electric vehicles and charging stations in the same charging situations.

With the electromobility charge testing system in accordance with the invention, it is possible for the communication between the electric vehicles and the charging stations to be reproduced and retested at any time in order to achieve a compatible software status.

Thanks to the invention, an interoperability test between electric vehicles and charging stations can be completely or partially replaced by emulations in various graduations, and realistically simulated by actions and reactions using the mechanisms shown here. Exchanging the measurement data and/or charging models via a server device or a database and linking to a cloud-based internet server with online exchange platform is intended to permit exchange between many users, and the emulation accuracy can be further refined by the collection of much measurement data and/or generation of many charging models by a high number of users.

It is advantageous for the measurement data and/or charging models to be uploaded to the server device, such that a universal and cross-type database can be built up and a possibility can be offered for flexible exchange of and addition to the measurement data and/or charging models. The database furthermore allows a wide coverage of the variety of types of electric vehicles and charging stations to be achieved. The server device, which in the narrower sense is a database, can be designed as an equipment-internal server device, i.e. data memory, or also as an external, in particular internet-based cloud server, or as a cloud-based server device, and can also be a mixed form of internal database and external data server.

The measurement data and/or charging models can be downloaded by other users from the server device using the emulation device. If it is measurement data that is downloaded, charging models can be generated on a local modeling device. If it is charging models that are downloaded, that data can be directly played back on an electronic unit, such that a charging operation and/or functions of the electric vehicle or charging station previously measured and/or simulated by a charging model are partially or completely emulated. It is advantageous to download the measurement data and/or charging models directly from the measuring device and/or modeling device by means of the emulation device. In the context of the invention, emulation in particular is regarded as the most realistic imitation possible of the charging operation on the part of the electric vehicle/charging station as the entity to be imitated. The emulation of the charging station/electric vehicle simulates here the actions and reaction of a charging operation at least in certain sub-aspects. The emulated electric vehicle/charging station receives the same data and energy inflows, performs comparable operations and achieves as far as possible the same results/outputs the same energy quantities and data as a real electric vehicle/charging station in the same charging situation.

Advantageously, metadata can be uploaded to the server device. The metadata comprises additional information on the electric vehicle and/or charging station or information on the measuring operation between the charging station and the electric vehicle, for example equipment manufacturer, equipment type, equipment model, date of manufacture, serial number, software version, recording date, photos of equipment, photos of rating plates, location of equipment, battery capacity, internal battery resistance and further battery data. The metadata can furthermore comprise information on the measuring device and/or modeling device, for example firmware version, equipment manufacturer, equipment type, hardware version and software scope. Both the measurement data and the models can be exchanged between many users via the server device, in particular by linking to the cloud-based internet server. Furthermore, uploading the measurement data and models allows a universal and cross-type database to be built up, and a possibility to be offered for flexible exchange and for additions to the measurement data and/or charging models. This makes it possible to achieve a wide coverage of the many types of electric vehicles and charging stations.

With the electromobility charge testing system in accordance with the invention, a charging station manufacturer is advantageously enabled, even without an actual electric vehicle, to test its product for interoperability with specific electric vehicle properties not available to the charging station manufacturer, using charging models and/or measurement data of the electric vehicles. For electric vehicle manufacturers, the interoperability of the electric vehicles can be tested by means of the charging models and/or measurement data of the charging stations without an actual charging station.

It is furthermore advantageous to exchange the measurement data and/or charging models worldwide using the electromobility charge testing system. This can save costs and time, and an attractive electromobility charge testing system of high flexibility can be achieved. The exchange can be limited by a restriction, for example by a financial transaction barrier, a registration barrier, a certification barrier or the like.

An electromobility charge testing system of high flexibility is thus achieved in accordance with the invention. With the electromobility charge testing system in accordance with the invention, costs and time can be saved.

In an advantageous development of the electromobility charge testing system, the measuring device can comprise an interface sub-device for connection to an electric vehicle and/or charging station, a recording sub-device and a network connection sub-device, wherein the measurement data is recordable via the interface sub-device by means of the recording sub-device, and is uploadable by the network connection sub-device to the server device and/or transferable to the modeling device. The network connection sub-device thus acts as a data interface of a system-internal communication between the individual devices of the system, wherein this can take place locally and also via the internet. The measuring device can be electrically connected to the charging station or to the electric vehicle via the interface sub-device and can comprise current and voltage sensors, as well as bus couplers or data recording sensors of a communication link between electric vehicle and charging station for measurement purposes. Furthermore, the interface sub-device can comprise actuators for coupling of current and voltage values, but also data contents, into the communication link. The measuring device can thus be used as a system interface between the charging station and the electric vehicle for recording their electrical behaviors such as current and voltage curves and transmitted analog and/or digital data and information contents in accordance with a communication standard during a charging operation, and further measured values such as temperature or resistance values from the interface sub-device. The measuring device can however also be used directly at an electric vehicle or charging station, to emulate the behavior of a counterpart by receiving and specifying corresponding communication contents and current and voltage values. The measuring device is in this case connected to the charging station and electric vehicle via the interface sub-devices or the system interface.

In a further advantageous development, the network connection sub-device can be designed as a cable-connected data interface, in particular as a CAN interface, Ethernet (incl. all real-time-capable and non-real-time-capable variants), LIN, RS232, GPIB, SPI, I2C, MOST-Bus, FlexRay, Profibus, CANopen, SERCOS. Alternatively or additionally, it can be designed as a wireless network connection sub-device, in particular as a mobile radio, WLAN or Bluetooth network connection sub-device, in the manner of a wireless data interface, such that the measurement data is transferable via the network connection sub-device inside the electromobility charge testing system and/or to the server device and/or to the modeling device. The recorded measurement data can thus be transferred flexibly and quickly via the NFC network connection sub-device to the server device, wherein server device and network connection sub-device may only be coupled when required, so that individual units can be manufactured at lower cost.

In a further advantageous development, at least one network connection sub-device, preferably a wire-connected network connection sub-device in particular designed with a CAN interface, Ethernet (incl. all real-time-capable and non-real-time-capable variants), LIN, RS232, GPIB, SPI, I2C, MOST-Bus, FlexRay, Profibus, CANopen, SERCOS, or a wireless network connection sub-device, in particular a radio, WLAN or Bluetooth network connection sub-device, can be comprised in the modeling device for reading out the measurement data from the measuring device and/or from the server device. Furthermore, at least one modeling sub-device for creating the charging models of the charging operation, in particular two modeling sub-devices for modeling a charging model of the electric vehicle and charging station, at least one processing sub-device for processing the measurement data into a data format adapted to the charging model, and at least one network connection sub-device for uploading the charging model to the server device and/or downloading measurement data from the server device and/or transmitting to the emulation device can be comprised. The measurement data can initially be read out from the measuring device and/or server device via the network connection sub-device of the modeling device. Prior to creation of a charging model, the data format of the measurement data can be adapted to the charging model by the processing sub-device. Generation of the charging model based on the measurement data with the adapted data format can then be performed by the modeling sub-device, with one or more models of the charging operation of the electric vehicle and/or charging station being generated. The charging models can be uploaded by the network connection sub-device to the server device, enabling other users to download the charging models from the server device when required. If charging models are already available on the server device, the charging models can be directly downloaded by the network connection sub-device and played back on the modeling device. It is advantageous that the charging models are also transferable by the network connection sub-device to the emulation device. This allows the electric vehicle and/or charging station to be efficiently simulated with a set of charging models.

In a further advantageous development, a subdividing device can be comprised which is configured to subdivide measurement data according to a predefined behavior of the electric vehicle and/or charging station, in particular into action data and reaction data. This is used for a more realistic representation of the charging model, since charging between the charging station and the electric vehicle can consist of an action and a reaction. To measure and record various reactions of the charging station, different electric vehicles can be connected to it. The measurement data can be subdivided by action and reaction and stored in the subdividing device. As soon as an electric vehicle is connected to the charging station, the action data stored in the subdividing device can be tested in accordance with the action of the electric vehicle to be tested, such that it can be determined whether an action identical or, as the case may be, similar to this can be performed. The reaction data adapting to the action of the electric vehicle can then be selected and the corresponding reaction of the charging station for the electric vehicle to be tested can be played back, in order to simulate the charging station as a charging model. If no identical or similar action is found, a predefined standard reaction can take place.

In a further advantageous development, the subdividing device can comprise at least one network connection sub-device for reading out and/or transferring or downloading and/or uploading of the measurement data from the measuring device and/or modeling device and/or server device, and at least one subdividing sub-device for performing a predefinable data subdivision. It is advantageous that at least one network connection sub-device is comprised in the subdividing device. This enables the users to download the measurement data, in particular the action data and reaction data, such that the users do not need to bring actual electric vehicles to the charging station for logging the reaction data of the charging station. The subdivision of the measurement data and/or charging models can be performed automatically by the subdividing sub-device or by a user.

In a further advantageous development, the subdividing sub-device can be comprised in the modeling device in order to permit use of the action data and reaction data (AD, RD) in different ways. This allows the electromobility charge testing system to be built in a compact manner, saving on installation space for the equipment.

In a further advantageous development, at least one analysis sub-device and/or simulation sub-device can be comprised in the modeling device, wherein the measurement data, subdividable into action data and reaction data, is analyzable, and the electrical behaviors, protocol parameters and communication contents of the charging operation of the electric vehicle and/or charging station are simulatable by the analysis and/or simulation sub-device. The recorded measurement data of the charging station and/or electric vehicle can be stored here as log files. These can be analyzed by the analysis sub-device. It is thus possible, for example, that an analysis relating to conformity with standards, for example according to at least one of the following standards IEC 61851-1, 61851-23, DIN 70121, ISO 15118, SAE J1772, CHAdeMO, GB/T, ChaoJi or other national or application-based standards, can be performed and evaluated, that any incorrect behavior in signals, in the protocol or during energy transport can be detected and/or average parameters of the signals, protocol contents or energy transport can be assessed, and also that evaluations relating to the technical or standard-compliant state of the specific electric vehicle and/or specific charging station (charging station, wall box etc.) can be performed. The signal behavior can be analyzed at the physical level in the context of a low-level signal behavior, in particular regarding the current and voltage curves and/or information-related contents, in particular high-level communication contents, can be analyzed. In addition, the electrical behaviors, protocol parameters and communication contents of the charging operation of the electric vehicle and/or charging station can be simulated. The simulation can comprise the expected input and generated output of signals that can be expected from an electric vehicle or charging station to be simulated. The simulation can also comprise the simulation of one or more failure scenarios of a charging station/electric vehicle to be simulated, in order to test a specification-conforming behavior of the specifically connected electric vehicle/charging station as the reaction. Electromobility charge testing systems at the electric vehicle and/or charging station can transmit the simulation data or the generated charging models of the charging station to the electric vehicle and/or the simulation data or generated charging models of the electric vehicle to the charging station. This permits a verification of how the real electric vehicle and/or real charging station react correspondingly to the "recorded" charging station and/or "recorded" electric vehicle and to what extent adaptations or tolerance increases are needed at the electric vehicle in order to "understand" this charging station. Furthermore, optimizations needed for the software can be indicated. All data records extracted as a result are compatible with the modeling device, such that the older and already archived log files can be used for measurement data extraction or measurement data simulation, and used for testing straight away.

In a further advantageous development, the emulation device can comprise at least one network connection sub-device for downloading the measurement data and/or charging models and at least one emulation sub-device, wherein the recorded or modeled electrical behaviors, protocol parameters and communication contents of the charging operation of the electric vehicle and/or charging station are imitable or emulatable by the emulation sub-device A "virtual" electric vehicle and/or a "virtual" charging station can be imitated and a "real" or actual charging station and/or a "real" or actual electric vehicle can be tested with a charging model or by measurement data.

In a further advantageous development, the emulation sub-device can comprise a selection sub-device configured to subdivide the measurement data and/or the data of the charging model downloaded from the server device, in particular into action data and reaction data, whereby prior to the emulation an adapted electrical behavior, protocol parameters and communication contents are providable manually, automatically or semiautomatically for a realistic simulation of the electric vehicle and/or charging station. It is alternatively advantageously conceivable that the emulation does not represent the reality 100%, but can simulate very many real conditions at least approximately. It is furthermore advantageous that a virtual simulation adapted to the object to be tested is provided by the subdivision, performed by the selection sub-device, of the measurement data into action data and reaction data.

As a rule, the measuring device and the modeling device can be structurally or spatially separated and connected to one another via standardized data interfaces. In a further advantageous development, the measuring device and the modeling device can be enclosed structurally in a housing. This permits a compact design of the electromobility charge testing system to be achieved.

As a rule, the modeling device and the emulation device can be structurally or spatially separated and connected to one another via standardized data interfaces. In a further advantageous development, the modeling device and the emulation device can be structurally enclosed in a housing. As a result, a compact design of the electromobility charge testing system can be advantageously achieved.

In a further advantageous development, the server device can be designed at least partially as a cloud-based internet server, wherein any access to the server device is preferably restricted and controllable by an access check sub-device. This allows a space-saving construction of the electromobility charge testing system to be achieved, and the worldwide exchange of measurement data or charging models via an online exchange platform to be simplified.

In a further advantageous development, the modeling device and/or the subdividing device can be arranged in the server device. It is thus possible to achieve, at a central point, processing of the measurement data, action data and reaction data and/or generation of a charging model, thereby facilitating software updates, saving on computation time and making the data exchange efficient, in particular with an internet-based server device acting as the online exchange platform.

Advantageously, a self-test of the charging model of a charging station and of an electric vehicle can be performed, wherein the charge testing system emulates both charging station and electric vehicle and performs tests for interoperability based on the charging models of the vehicle and charging station. This allows the validity of the charging model to be verified, which can advantageously be performed by the modeling device preferably integrated in the server device.

In a further advantageous development, the measurement data and/or the charging model can comprise metadata on the electric vehicle and/or charging station which is logged by the measuring device during measurement between the charging station and the electric vehicle, in particular equipment manufacturer, equipment type, date of manufacture, serial number, software version, recording date, equipment image/photos, rating plate, equipment location, battery capacity and/or battery internal resistance, and information on the measuring device such as equipment type, firmware version, equipment manufacturer, hardware version, and/or software scope. The metadata can be automatically logged, for example by scanning a QR code or RFID-TAG or entered manually by a user and taken into account during modeling.

In a subordinate aspect, the invention relates to an electromobility charge testing method for generating and exchanging measurement data and/or charging models of electrical behaviors, in particular voltage and/or current behaviors, protocol parameters and communication contents of a charging operation of an electric vehicle and/or charging station, and for testing the communication capability of the electric vehicle and/or charging station, in particular by an electromobility charge testing system. The electromobility charge testing system comprises the following steps:
  measuring the electrical behaviors, protocol parameters and communication contents of the charging operation of the electric vehicle and/or charging station by the measuring device, wherein the measurement data is subdivided into action data and reaction data;
  automatically generating a charging model of the charging operation for the action data and reaction data by the modeling device, based on the logged measurement data;
  uploading the measurement data and/or charging model to the server device via a network;
  downloading the measurement data and/or charging model by means of the emulation device via the network or direct reception from the modeling device and/or measuring device;
  emulating the charging operation by the emulation device by playing back measurement data subdivided into action data and reaction data and/or the correspondingly generated charging model to the emulation device.

With an electromobility charge testing method of this type, the advantages described with reference to the system in accordance with the invention can also be achieved.

In an advantageous development of the electromobility charge testing method, the charging models and/or measurement data can be emulated on the emulation device manually, automatically or semiautomatically.

In a further advantageous development, before the measurement data is uploaded to the server device it can be subdivided by means of a subdividing device, in particular a subdividing sub-device, according to a predefined behavior of the electric vehicle and/or charging station, in particular into action data and reaction data. Advantageously, the measurement data and/or charging models can be subdivided by action and reaction and stored in the subdividing device. This permits a separation of the communication data output from the electric vehicle or charging station.

In a further advantageous development, the action data and reaction data can be processed in one or more databases in order to process in a structured manner the large amount of action data and reaction data of one or many electric vehicles or of one or many charging stations, and to access it quickly.

In a further advantageous development, the measurement data can be analyzed before it is uploaded to the server device by means of an analysis sub-device, and the electrical behaviors, protocol parameters and communication contents of the charging operation of the electric vehicle and/or charging station simulated by means of the simulation sub-device.

In a further advantageous development, any access to the server device can be controlled via an access check sub-device. As a result, the server device can be provided in a security-protected network, in particular as an access-protected online exchange platform, thus permitting various access, pricing and payment models.

BRIEF DESCRIPTION OF THE DRAWINGS

Further advantages are revealed by the figures and the associated description of the drawing. The figures show examples of the invention. The figures, the description and the claims contain many features in combination. A person skilled in the art will expediently also consider these features individually and combine them into meaningful further combinations. In the figures:

DETAILED DESCRIPTION OF THE INVENTION

Identical or similar components are given the same reference signs in the figures.

Figure 1:
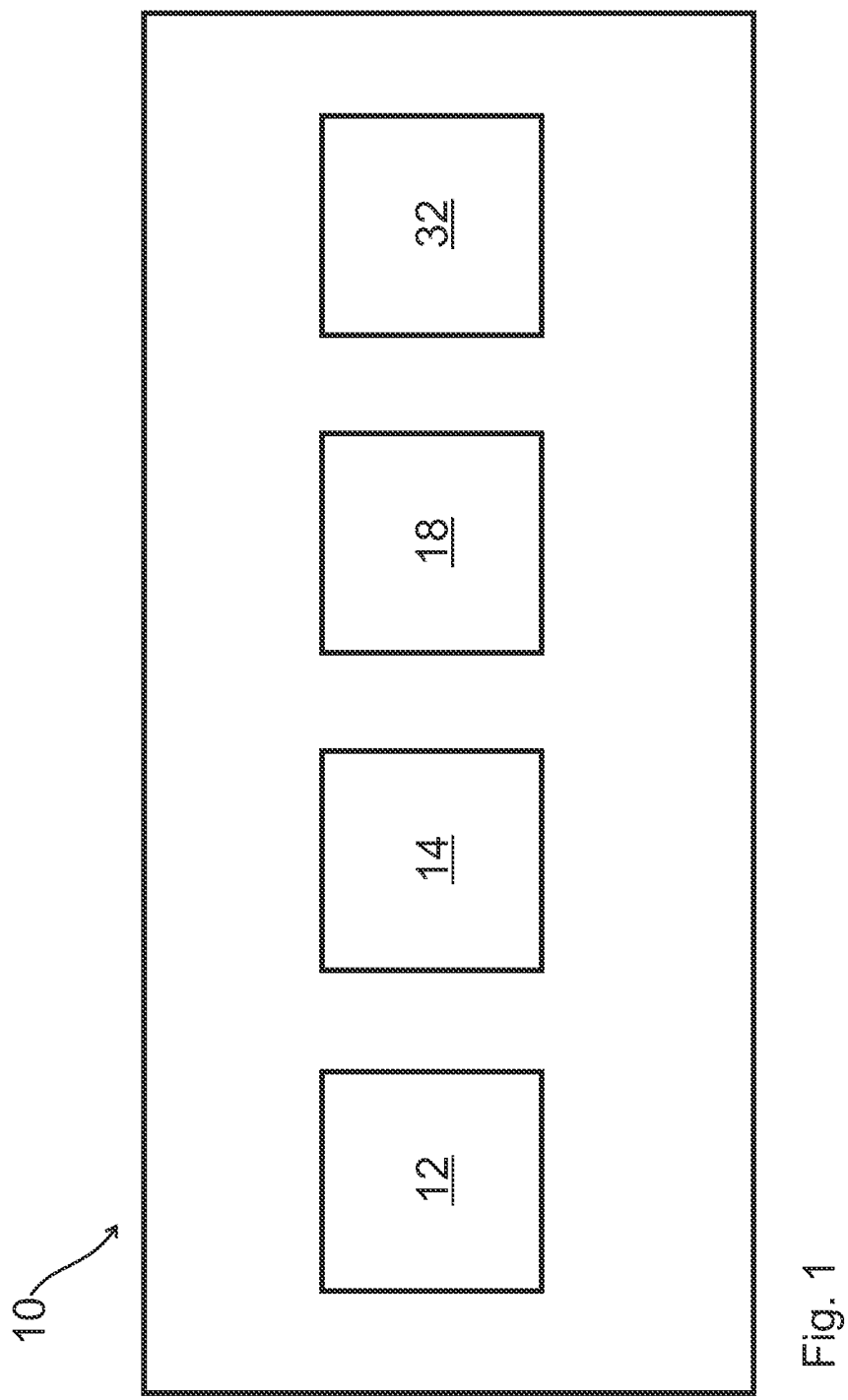
FIG. 1 shows a schematic representation of an example of an electromobility charge testing system in accordance with the invention.
Figure 10:
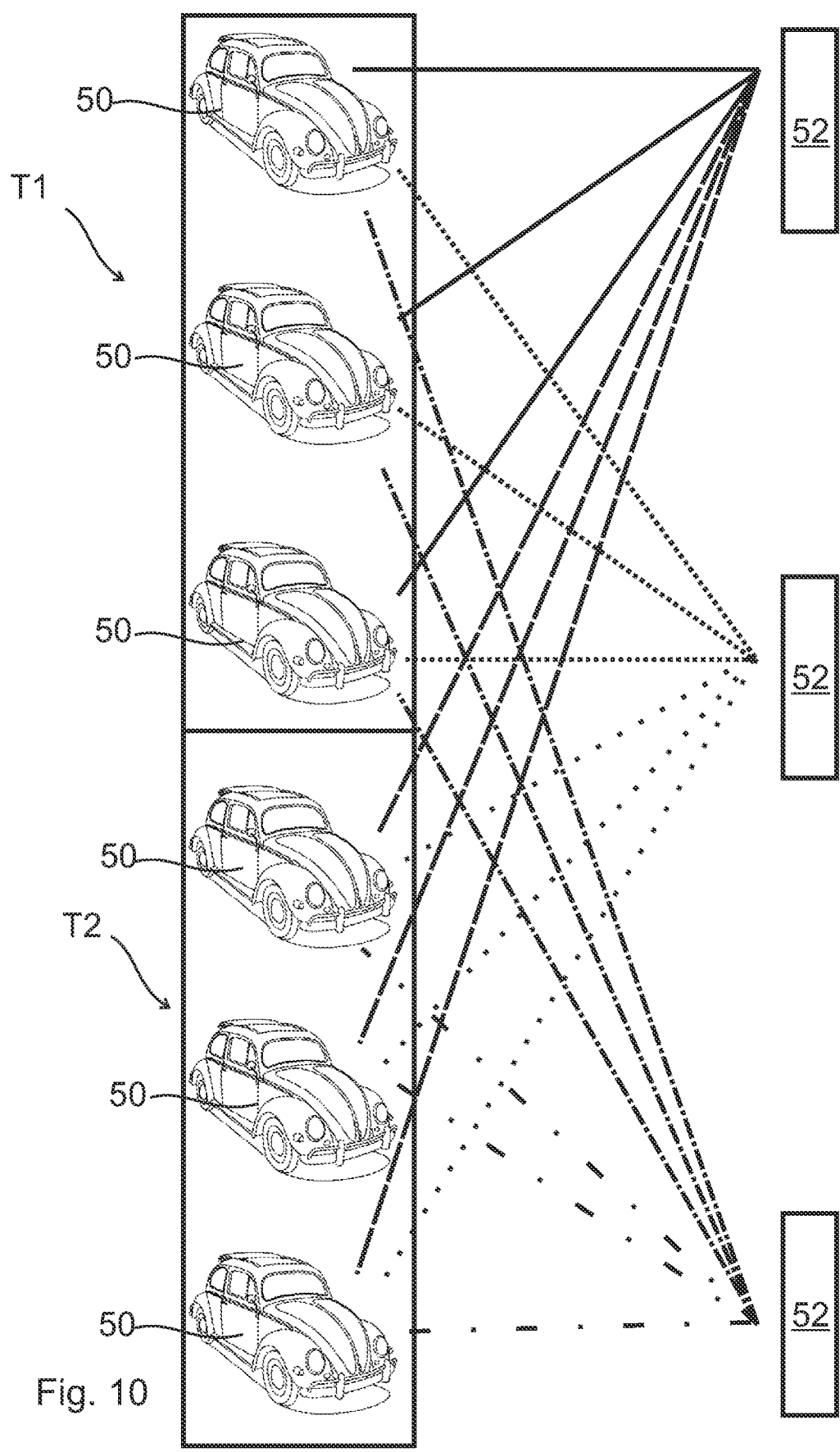
FIG. 10 is a schematic representation of the interoperability of various electric vehicles and various charging stations.

FIG. 1 represents an electromobility charge testing system 10 for generating and exchanging measurement data 58 and/or charging models of electric behaviors, in particular voltage and/or current behaviors, protocol parameters and communication contents of a charging operation of an electric vehicle 50 and/or charging station 52 shown in FIG. 10, and for testing the communication capability of the electric vehicle 50 and/or charging station 52. The electromobility charge testing system 10 comprises a measuring device 12 for providing measurement data 58 of the electrical behaviors, protocol parameters and communication contents of the charging operation of the electric vehicle 50 and/or charging station 52; a modeling device 14 for generating a charging model of the charging operation; a server device 18 for storage and provision of an exchange possibility for the measurement data 58 and/or charging models; and an emulation device 32 for downloading the measurement data 58 and/or the charging model 60 from the measuring device 12 and/or from the modeling device 14, and/or server device 18 and for emulating the charging operation of charging station 52 and/or electric vehicle 50 by playing back the measurement data 58 and/or charging model 60. The electromobility charge testing system 10 can be designed as one unit integrated in a housing, or as a split system with spatially separated individual units.

Figure 2:
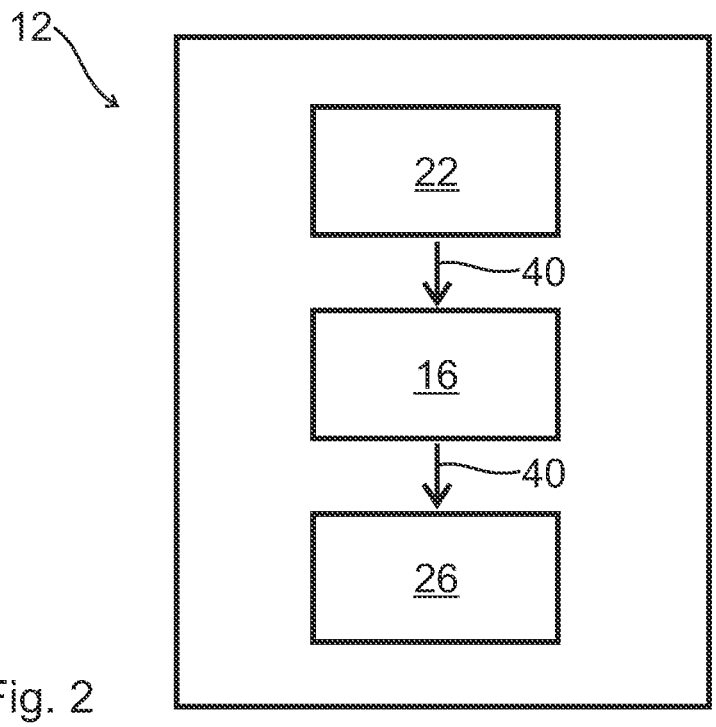
FIG. 2 is a schematic representation of a measuring device according to an embodiment.

FIG. 2 illustrates schematically and in detail the measuring device 12 shown in FIG. 1. The measuring device 12 comprises an interface sub-device 22, a recording sub-device 16 and a network connection sub-device 26. The electric vehicle 50 can be connected to the charging station 52 via the interface sub-device 22. The interface sub-device 22 can be designed for example as a charging plug or charging coupler of an electric vehicle or charging station. The measurement data 58 are recordable by the interface sub-device 22 during a measuring operation 40 by means of the recording sub-device 16 and can be uploaded by the network connection sub-device 26 to the server device 18 and/or transferred to the modeling device 14. An interface sub-device 22 can for example log or generate/supply current and voltage values, i.e. bidirectionally tap measurement data or emit signals, and forms the interface for recording of measurement data and input and output of emulation signals. During emulation, therefore, actions and reactions relative to an electric vehicle 50/charging station 52 can be output/received, and energy flows and communication data can be recorded when obtaining the measurement data.

Figure 3A:
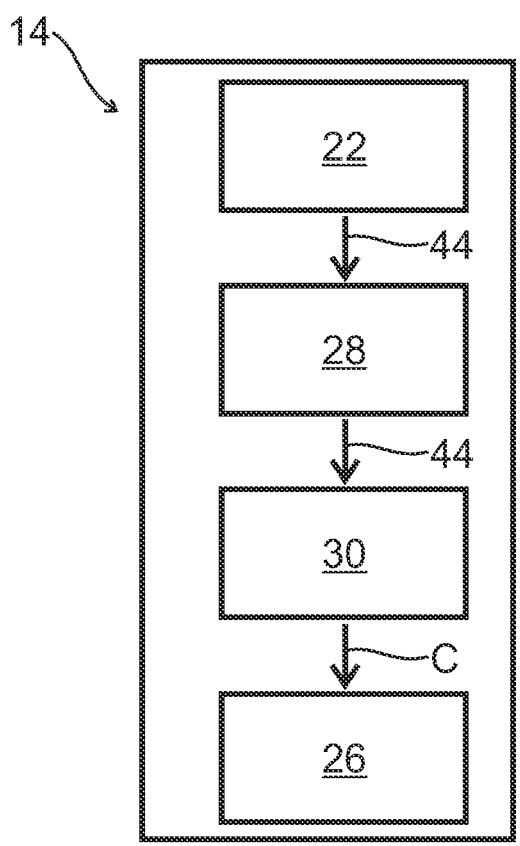
FIGS. 3*a, b* are two schematic representations of modeling devices according to embodiments.

The embodiment of a modeling device 14 shown in FIG. 1 furthermore comprises, according to FIG. 3a, an interface sub-device 22 for logging measurement data, a processing sub-device 28, a modeling sub-device 30 and a network connection sub-device 26. With integration in a housing, the measuring device 12 and the modeling device 14 can access the same interface sub-device 22 and network connection sub-device 26, and a direct data exchange between measuring device 12 and modeling device 14 can take place. Otherwise, the modeling device 14 can be electrically connectable by the interface sub-device 22 to the measuring device 12, or log measurement data directly, such that the measurement data 58 can be transferred to the modeling sub-device 30 via the interface sub-device 22 during a modeling operation 44. The measurement data 58 is initially processed by the processing sub-device 28 into a data format adapted to the charging model. The measurement data 58 can then be modeled by the modeling sub-device 30, and as a result the charging modelcan be generated, which is suitable for representing an emulation-capable simulation of the electric vehicle 50 or charging station 52. The charging model can be uploaded by the network connection sub-device 26 to the server device 18 by an uploading operation C and/or transferred directly to the emulation device 32.

Figure 4A:
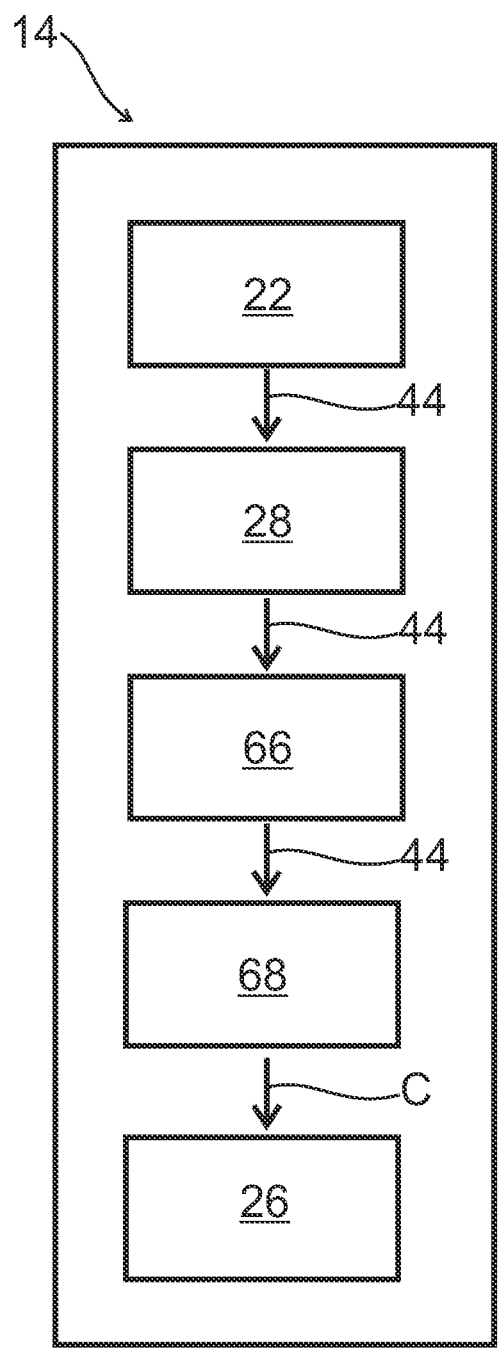
FIG. 4*a, b* are two schematic representations of modeling devices according to embodiments.

Alternatively to the modeling device 14 in FIG. 3a, the modeling device 14 shown in FIG. 4a can be used in the electromobility charge testing system 10. An interface sub-device 22 for recording measurement data, a processing sub-device 28, an analysis sub-device 66, a simulation sub-device 68 and a network connection sub-device 26 are arranged in the modeling device 14. A subdividing sub-device 36 is connected between the processing sub-device 28 and the analysis sub-device 66. Measured data 58 can be subdivided by the subdividing sub-device 36 according to a predefined behavior of the electric vehicle 50 and/or charging station 52, in particular subdivided into action data and reaction data. The subdivided measurement data 58 can be analyzed by the analysis sub-device 66 and the electrical behaviors, protocol parameters and communication contents of the charging operation of the electric vehicle 50 and/or charging station 52 can be simulated by the simulation sub-device 68. The charging models 60 can thus be generated. For the uploading C of the charging models 60, they are transferred from the modeling sub-device 30 to the network connection sub-device 26, and uploaded from there to a server or database.

Figure 5A:
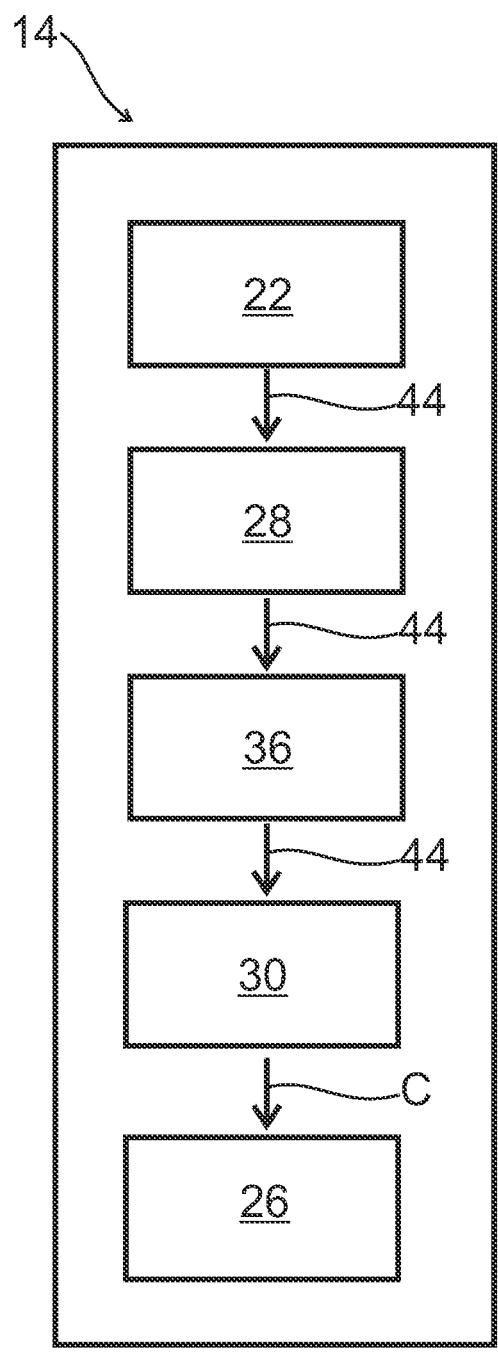
FIGS. 5*a, b* are two schematic representations of modeling devices according to embodiments.

Alternatively to the modeling device 14 in FIG. 3a, the modeling device 14 shown in FIG. 5a can be used in the electromobility charge testing system 10 shown in FIG. 1. An interface sub-device 22 for recording measurement data, a processing sub-device 28, a modeling sub-device 30 and a network connection sub-device 26 are arranged in the modeling device 14, as in the embodiment of the modeling device according to FIG. 3a. A subdividing sub-device 36 is connected between the processing sub-device 28 and the modeling sub-device 30. Measured data 58 can be subdivided by the subdividing sub-device 36 according to a predefined behavior of the electric vehicle 50 and/or charging station 52, in particular subdivided into action data and reaction data. This considerably facilitates modeling, since the communication signals are subdivided by transmitter. For the uploading C of the charging models 60, they are transferred from the modeling sub-device 30 to the network connection sub-device 26, and uploaded from there to a server or database.

Figure 3B:
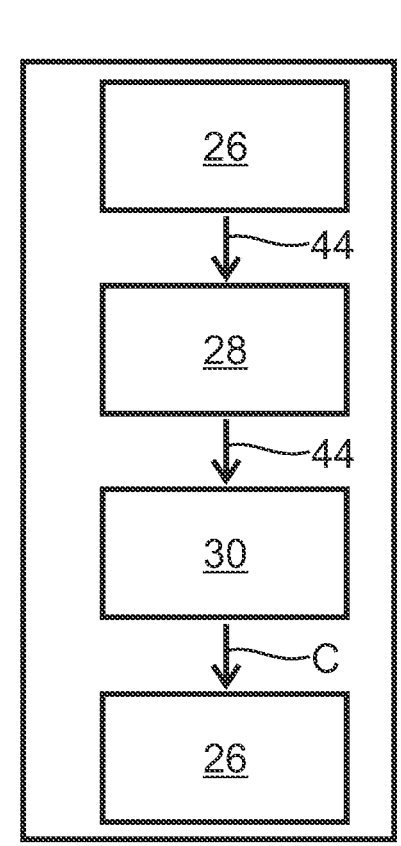
Figure 4B:
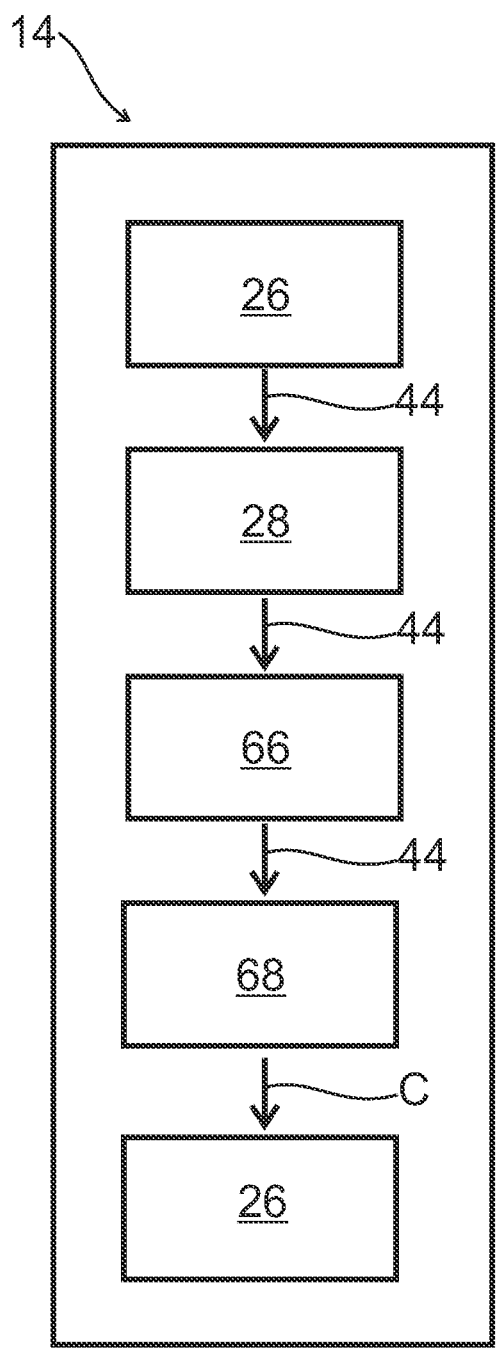
Figure 5B:
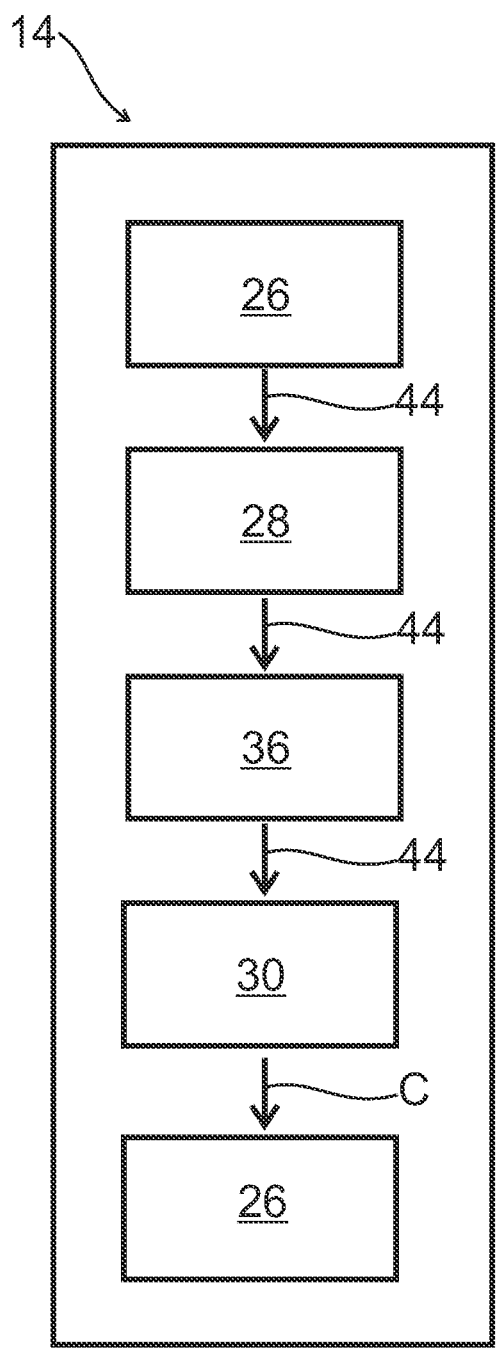

Alternatively to the above embodiments of a modeling device 14 according to FIG. 3a, FIG. 4a or FIG. 5a, already logged measurement data, for example measurement data logged by a measuring device 12 according to FIG. 2, can, in accordance with the embodiments shown in FIG. 3b, 4b or 5b, be received via the one or via a second network connection sub-device 26 from a storage sub-device 24 or server device 18, for example an external cloud storage, or directly from the external measuring device 12 according to FIG. 2, instead of an interface sub-device 22 permitting direct logging of measurement data. This allows an interface sub-device 22 to be dispensed with. The modeling device 14 can thus be comprised externally by the measuring device 12, for example centrally in an internet server application or in an external measuring apparatus that receives data of the measuring device 12 via a network or a memory.

Figure 6A:
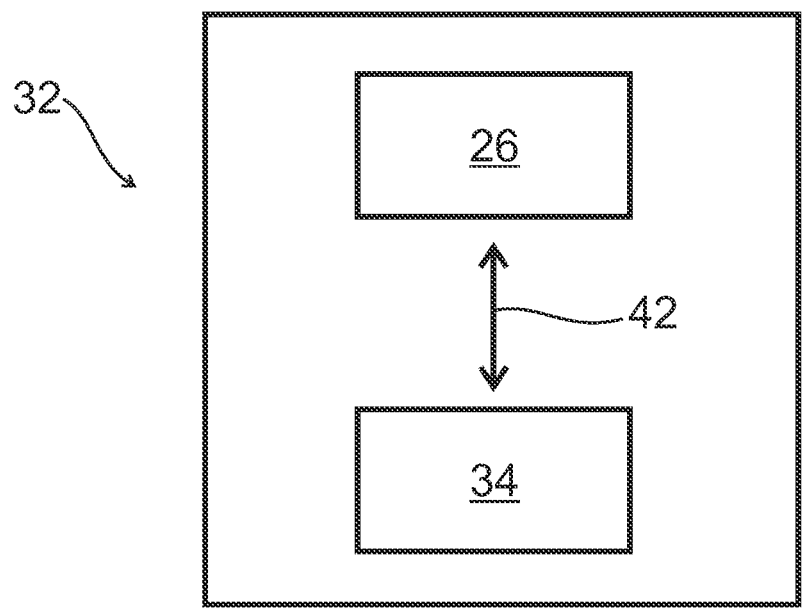
FIGS. 6*a, b* are two schematic representations of emulation devices according to embodiments.
Figure 6B:
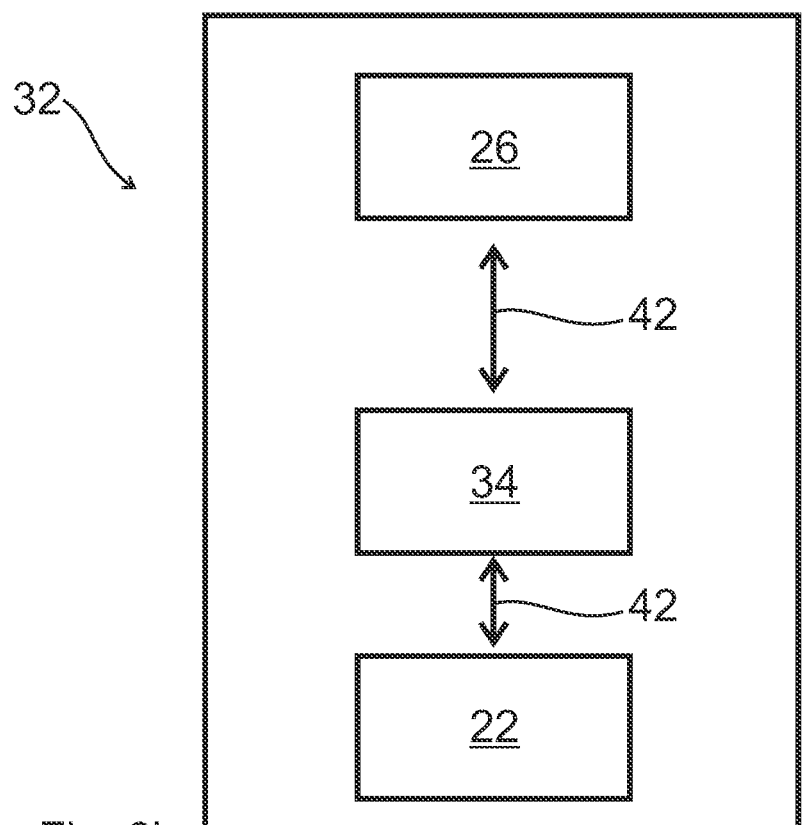

FIGS. 6a and 6b show schematically embodiments of an emulation device 32 used for playing back a charging model 60 or measurement data 58 to reproduce in detail a charging behavior of an electric vehicle 50 or charging station 52. To do so, the emulation device 32 comprises a network connection sub-device 26 and an emulation sub-device 34. Measured data 58 and/or the charging model 60 can be downloaded from the server device 18 by the network connection sub-device 26 and transmitted to the emulation sub-device 34, if these are not integrated in a housing. During an emulation operation 42, the measured or modeled electrical behaviors, protocol parameters and communication contents of the charging operation of the electric vehicle 50 and/or charging station 52 can be emulated, i.e. simulated and played back by means of the network connection sub-device 26—see FIG. 6a—to simulate communication of the charging method with a charging station 52 or vehicle 50. An emulation of the charging behavior can thus be performed in a stand-alone unit.

Alternatively, as shown in FIG. 6b, the emulation can, being physically connected by the interface sub-device 22, be played back as a counterpart to an electric vehicle 50 or charging station 52.

Figure 7:
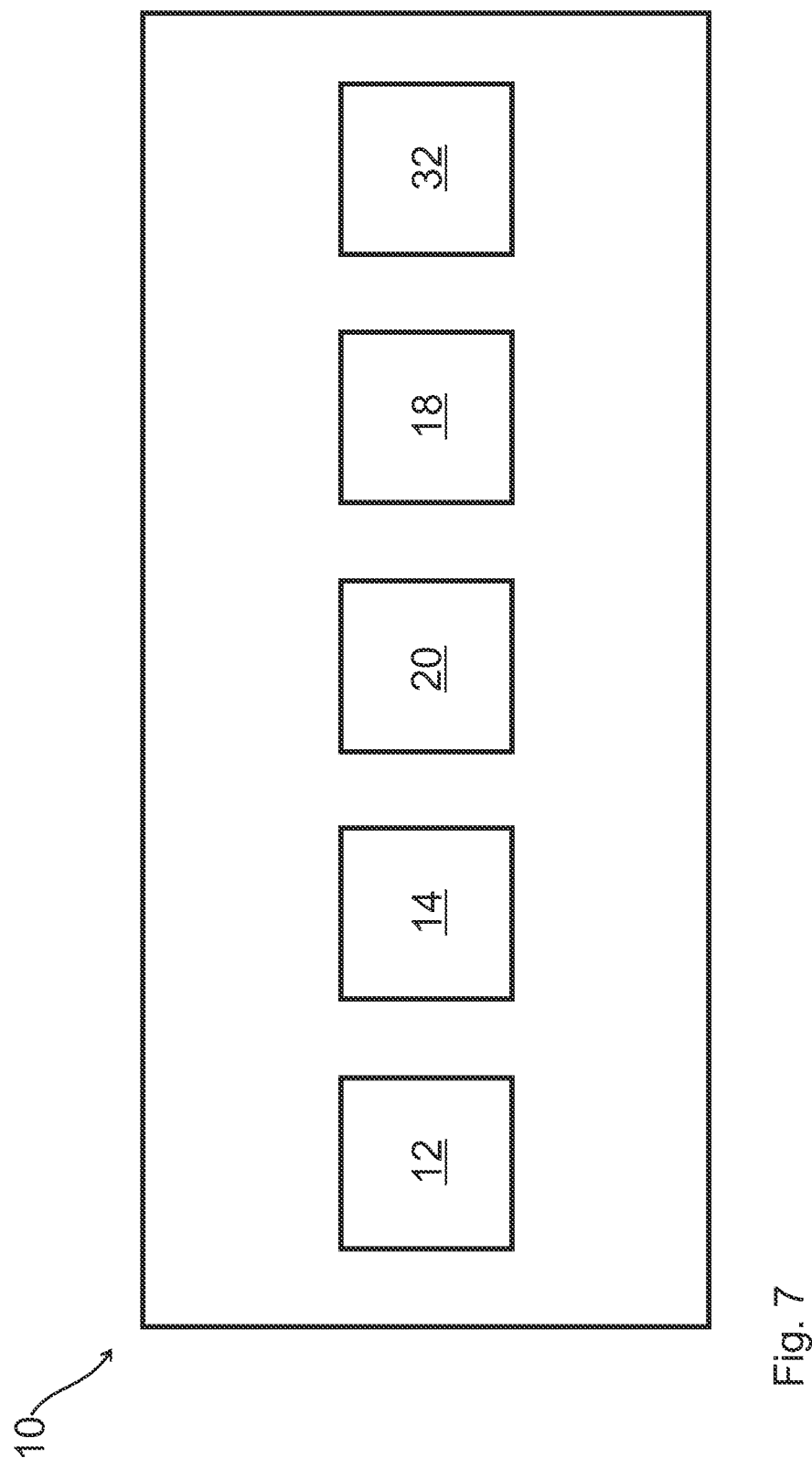
FIG. 7 is a schematic representation of an example of an electromobility charge testing system in accordance with the invention.

In comparison to FIG. 1, FIG. 7 represents a further embodiment of an electromobility charge testing system 10, in which a subdividing device 20 is provided between a modeling device 14 and a server device 18. By means of the subdividing device 20, measurement data 58 of the server device 18 received from the modeling device 14 can be subdivided before creation of the charging model 60 according to a predefined behavior of the electric vehicle 50 and/or charging station 52, in particular subdivided into action data and reaction data.

Figure 8A:
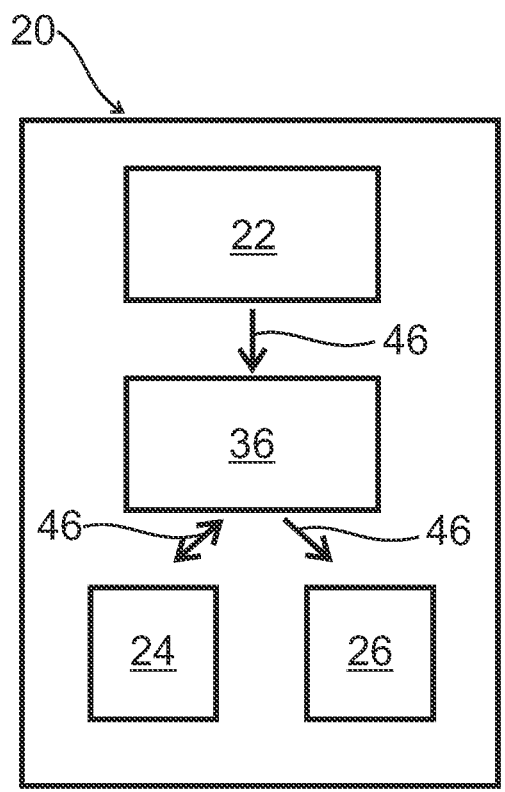
FIGS. 8*a, b* are two schematic representations of subdividing devices according to embodiments.

The embodiment shown in FIG. 8a of a subdividing device 20 as a single unit comprises an interface sub-device 22, a subdividing sub-device 36, a network connection sub-device 26 and a storage sub-device 24 according to FIG. 8a. Measured data 58 can be logged via the interface sub-device 22 during a charging operation and transferred to the subdividing device 20. During a subdividing operation 46, the measurement data 58 is to be subdivided by the subdividing sub-device 36 into action data or reaction data according to a predefined behavior of the electric vehicle 50 and/or charging station 52. The subdivided measurement data 58 can be uploaded via the network connection sub-device 26 to the server device 18 and/or stored on the storage sub-device 24 of the subdividing device 20. The storage sub-device 24 can be part of the server device 18 and act as a local server device 18, but can also be used as internal storage for measurement data evaluation, charging model generation and offline data storage.

Figure 8B:
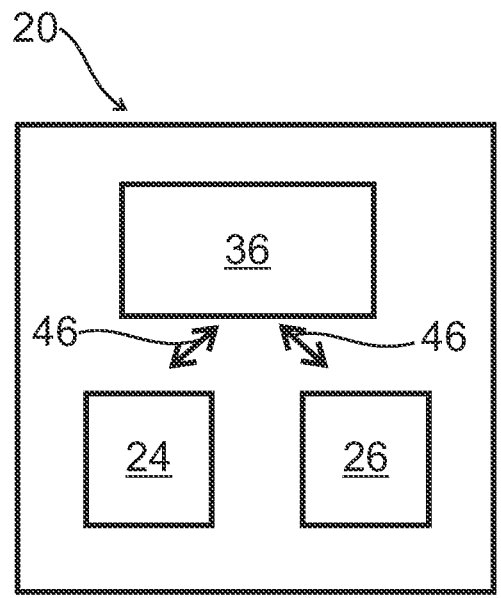

Alternatively to the above embodiment of a subdividing device 20 according to FIG. 8a, in the embodiment according to FIG. 8b already logged measurement data, for example measurement data logged by a measuring device 12 according to FIG. 2, can be received via the one or via a second network connection sub-device 26 from an external storage sub-device 24 or server device 18, for example an external cloud storage, or directly from the external measuring device 12 according to FIG. 2, instead of an interface sub-device 22 permitting direct measurement data logging. This allows an interface sub-device 22 to be dispensed with. The subdividing device 20 can thus be comprised externally by the measuring device 12, for example centrally in an internet server application or external measuring apparatus that receives data of the measuring device 12 via a network or a memory.

Figure 9:
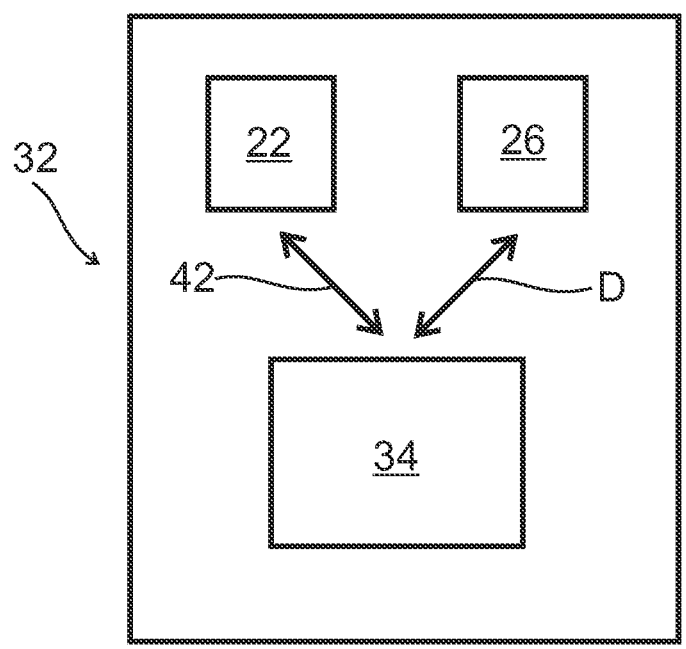
FIG. 9 is a schematic representation of an emulation device according to an embodiment.

FIG. 9 shows an emulation device 32 as an individual unit comprising an interface sub-device 22, a network connection sub-device 26 and an emulation sub-device 34. The emulation device 32 is electrically connected by the interface sub-device 22 to a charging station 52 or to an electric vehicle 50, and can emulate the behavior of the respective counterpart by receiving and specifying charging communication data and, where applicable, current and voltage values. The measurement data 58 and/or the charging model 60 to be played back can be downloaded via the network connection sub-device 26 to the emulation device 32, with the network connection sub-device 26 being designed preferably as a wireless network connection sub-device, in particular a mobile radio, WLAN or NFC network connection sub-device. Measured data 58 can be subdivided by a selection sub-device 38 of the emulation device 32, in particular into action data and reaction data, wherein corresponding reaction data can be output when action data of the connected test object is received. As a result, an adapted electrical behavior, protocol parameters and communication contents can be provided prior to the emulation for a realistic simulation of the electric vehicle 50 and/or charging station 52.

FIG. 10 shows variants of vehicles 50 of two types T1, T2 and three different types of charging stations 52, wherein a charging operation of each vehicle 50 at each charging station 52 would have to be tested for comprehensive and cross-type interoperability. Testing these would mean, even with the minimal variety of types shown, heavy expense from bringing each vehicle 50 into spatial contact with each charging station 52, as well as adapted test equipment. The aim of the invention is to drastically simplify the interoperability test and to simplify the modeling of the interoperability test for new types of vehicles 50 or new charging stations 52.

Figure 11:
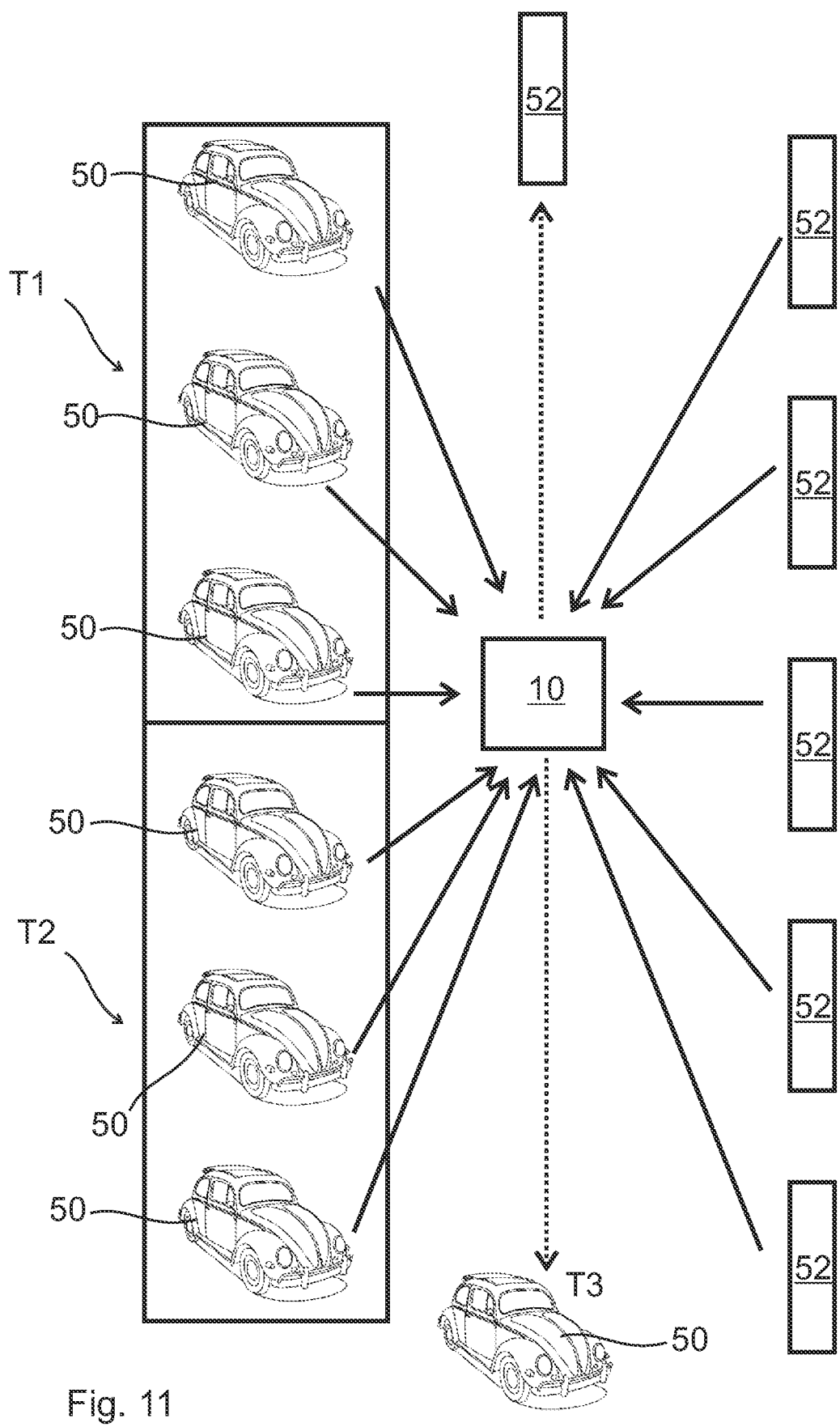
FIG. 11 is a schematic representation of the interoperability of an example of a electromobility charge testing system in accordance with the invention, connected to various electric vehicles and charging stations.

FIG. 11 shows in this connection three variants of vehicles 50 of the basic types T1 and T2, a new vehicle type T3 and also three types of charging stations 52 which can each be connected sequentially to an embodiment of an electromobility charge testing system 10 via a measuring sub-device. The individual charging operations of the electric vehicles 50 and the charging station 52 can be emulated by the electromobility charge testing system 10. To do so, it is necessary for a charging operation of each vehicle variant 50 to be recorded once with each charging station variant 52 by the charge testing system 10. After that it is possible, even without the physical presence of the counterpart of each electric vehicle 50, to test new T3 variants or every charging station 52, even new variants. Since an exchange of the measurement data 58 and/or charging models 60 is possible via a central internet server, every charging station or vehicle manufacturer all over the world can test every vehicle or charging station for interoperability however far away.

Figure 12:
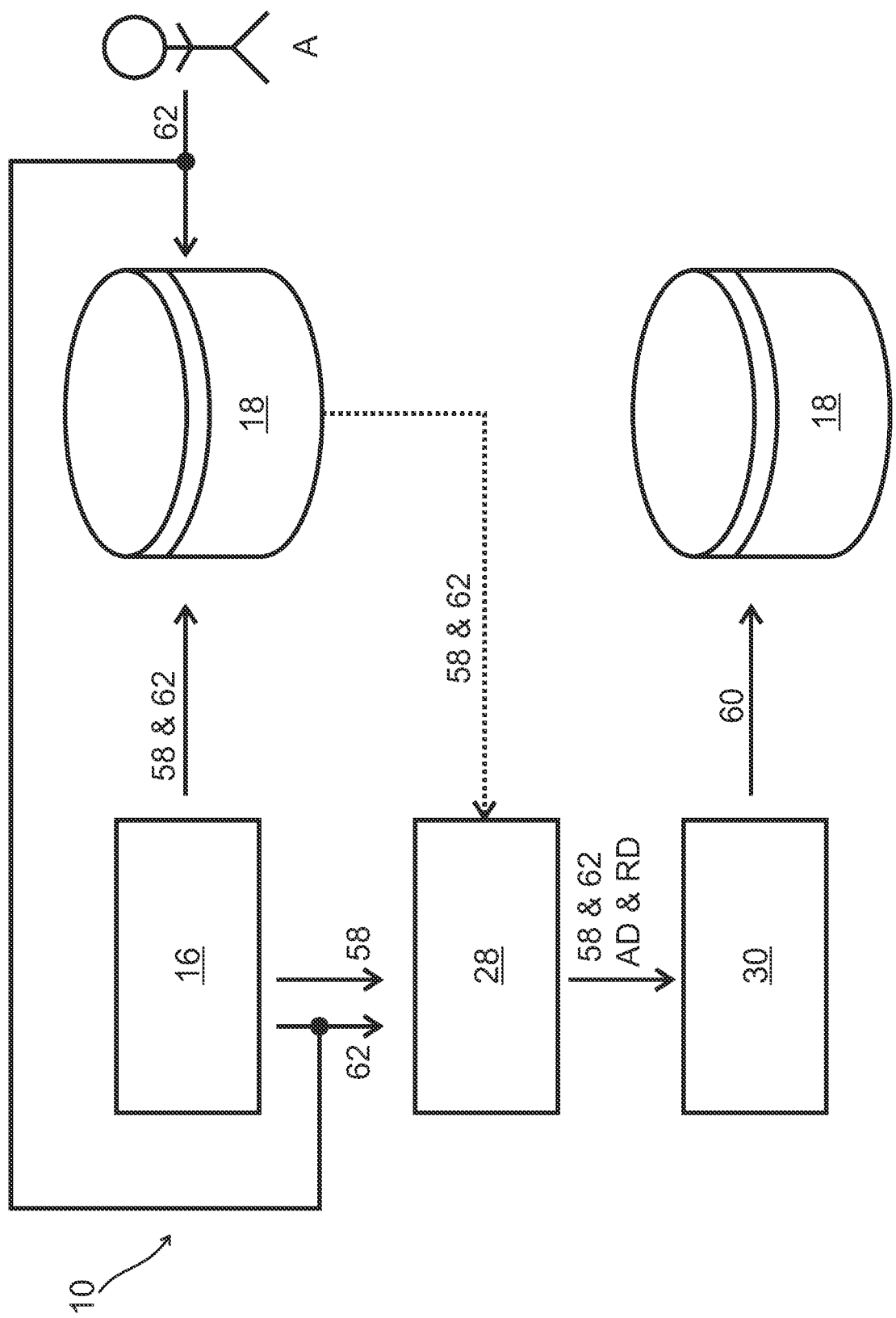
FIG. 12 is a schematic representation of an example of an electromobility charge testing system in accordance with the invention.

According to FIG. 12, electrical behaviors, protocol parameters and communication contents of a charging operation of an electric vehicle 50 and/or charging station 52 can be recorded by a recording sub-device 16 of a measuring device 12 with an embodiment of the charge testing system 10. The measurement data 58 can be transferred to a processing sub-device 28 of a modeling device 14, wherein the measurement data 58 can be processed by means of the processing sub-device 28 into action data AD and reaction data RD and into a data format adapted to the charging model 60. The measurement data 58 can be passed on to a modeling sub-device 30 of the modeling device 14. This allows the charging operation to be modeled, allowing charging models 60 to be generated based on the measurement data 58. Both the measurement data 58 and the charging models 60 can be uploaded to a server device 18. A user A can manually or semiautomatically upload metadata 62 of the electric vehicle 50 and/or charging station 52 to a server device 18, including for example images of the vehicle, of the charging station or of the rating plate etc. These can both be filed in the server device 18 and passed on to the processing sub-device 28, combined for example with the measurement data 58 recorded by the recording sub-device 16. In the example shown, a first server device 18 is provided for the measurement data 58 recorded by the recording sub-device 16, and recorded metadata 62 can also be filed there. Separately from this, the charging models 60 obtained from the modeling sub-device 30 can be filed in a further, for example internet-based second server device 18.

The illustration of further sub-devices that could be sensibly added, for example a network connection sub-device 26, is dispensed with here.

Figure 13:
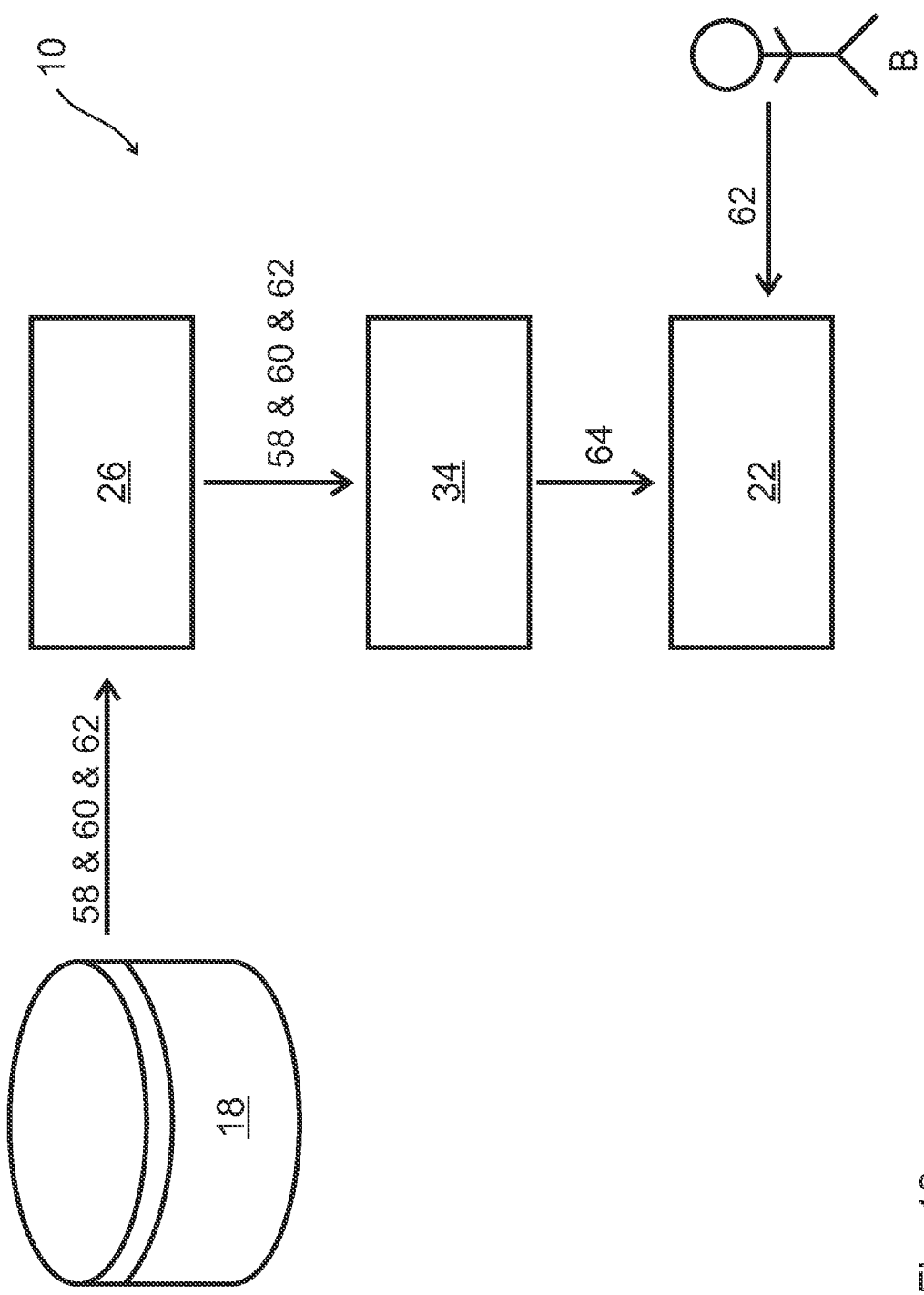
FIG. 13 is a schematic representation of an example of an electromobility charge testing system in accordance with the invention.

The measurement data 58 and/or charging models 60 and the metadata 62 stored on the server device 18 can in accordance with FIG. 13 be downloaded from the server device 18 by a network connection sub-device 26 of an emulation device 32. A user B can connect an object to be tested or an electric vehicle 50 or a charging station 52 to the emulation sub-device 34 via an interface sub-device 22; as a rule this is done with a corresponding charging plug or charging socket. Emulation data 64, comprising electrical behaviors, protocol parameters and communication contents, and the specific boundary conditions defined by the charging model 60 or by playing back measurement data 58 taking into account the metadata 62, can be emulated by the emulation sub-device 34. This is done at the electrical level via the interface sub-device 22. The use of charging models 60 is to be preferred, since far smaller data quantities are needed and even divergent charging behavior can be emulated.

Figure 14:
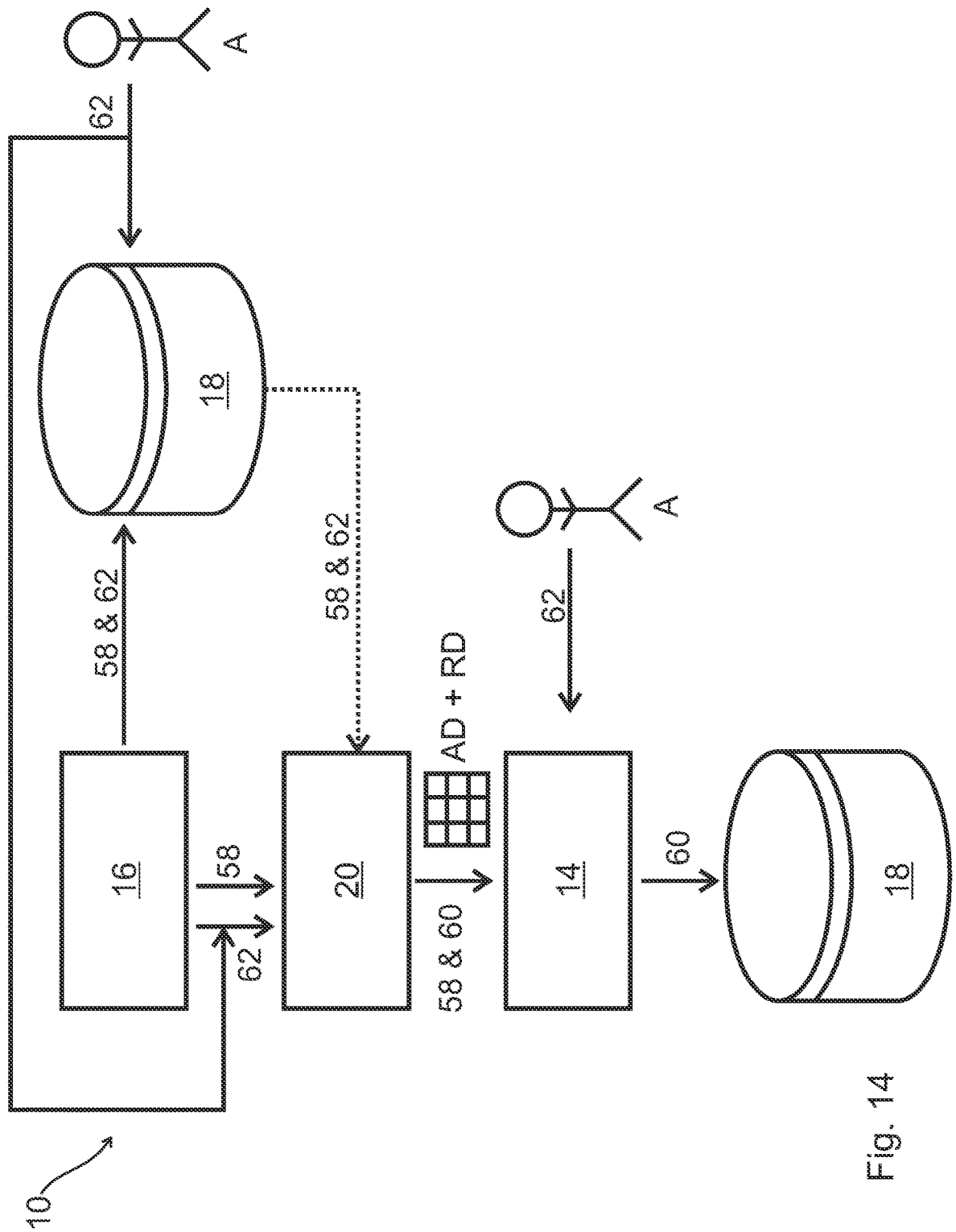
FIG. 14 is a schematic representation of an example of an electromobility charge testing system in accordance with the invention.

In a further example shown in FIG. 14 of an electromobility charge testing system 10, a recording sub-device 16 of a measuring device 12, a subdividing device 20, a modeling device 14 and a first server device 18 are comprised. A user A can upload metadata 62 of the electric vehicle 50 and/or charging station 52 to the server device 18 and supply it to the subdividing device 20 combined with measurement data 58 of the recording sub-device 16. A charging operation of the electric vehicle 50 and/or charging station 52 can be recorded by the recording sub-device 16 by means of the measurement data 58, and metadata 62 can be automatically determined. The measurement data 58 and metadata 62 are transferred to the subdividing device 20 and stored in the server device 18. Alternatively, the measurement data 58 uploaded to the server device 18 by other users can be downloaded from the server device 18 directly to the subdividing device 20. The measurement data 58 is subdivided there into action data AD and reaction data RD of the test object, taking into account the metadata 62. The measurement data 58 subdivided into AD and RD can be transmitted further to the modeling device 14, and from this a charging model 60 of the charging behavior of the test object can be generated. The charging model 60 can be uploaded to a further, second server device 18 for charging models 60 and prior to that supplemented by further metadata 62 where applicable. The first and second server device 18 can be identical, or be an equipment-internal first server device and an internet-based second cloud-based server device 18.

As soon as an object to be tested is connected to the electric vehicle 50 and/or charging station 52, the action data AD can be tested in accordance with the action of the object to be tested. It can thus be determined whether an action identical or, as the case may be, similar to this can be performed. The reaction data RD adapting to the action of the object to be tested can then be selected and the corresponding reaction of the electric vehicle and/or charging station can be played back. If no identical or similar action is found, a predefined standard reaction can take place.

Figure 15:
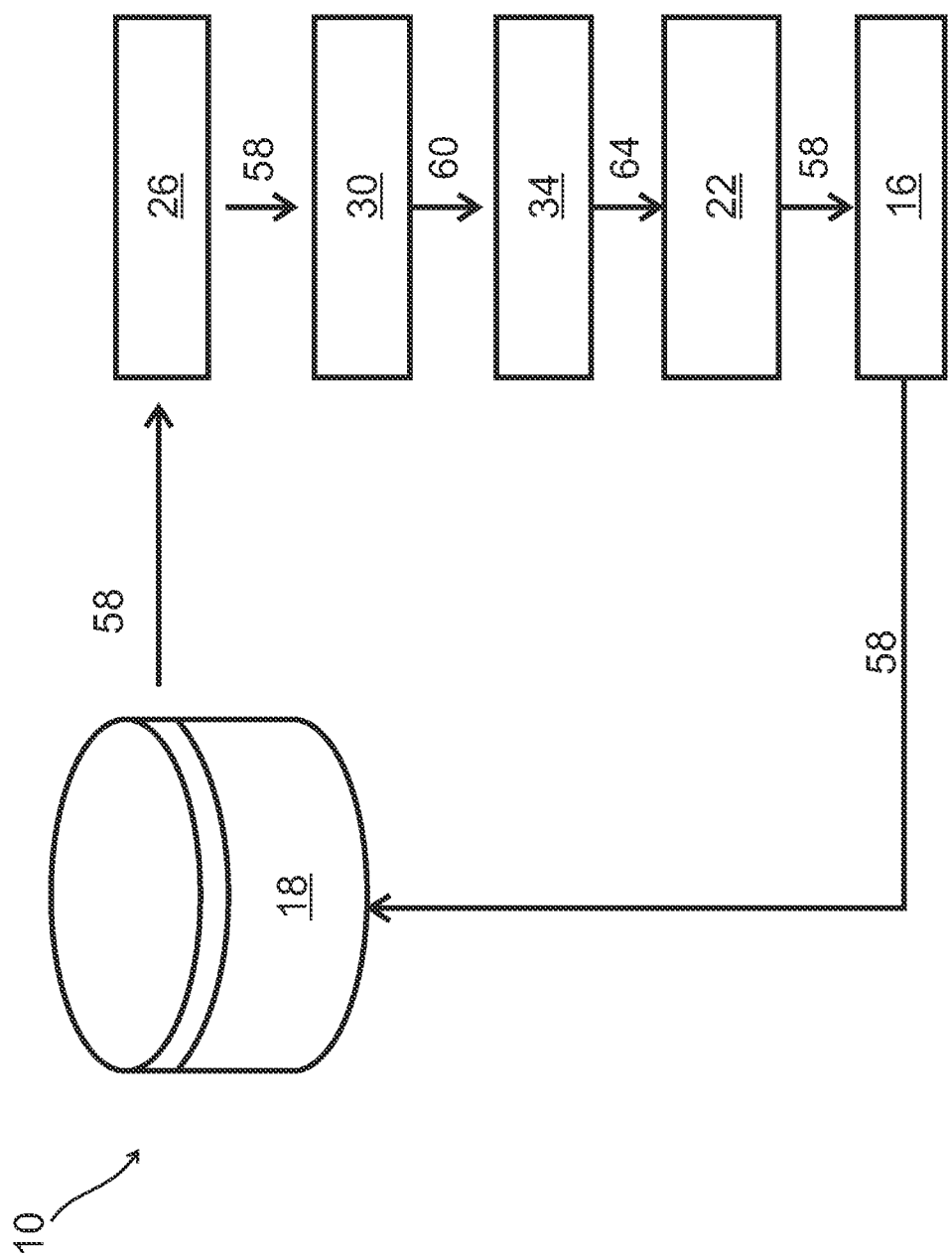
FIG. 15 is a schematic representation of an example of an electromobility charge testing system in accordance with the invention.
Figure 16:
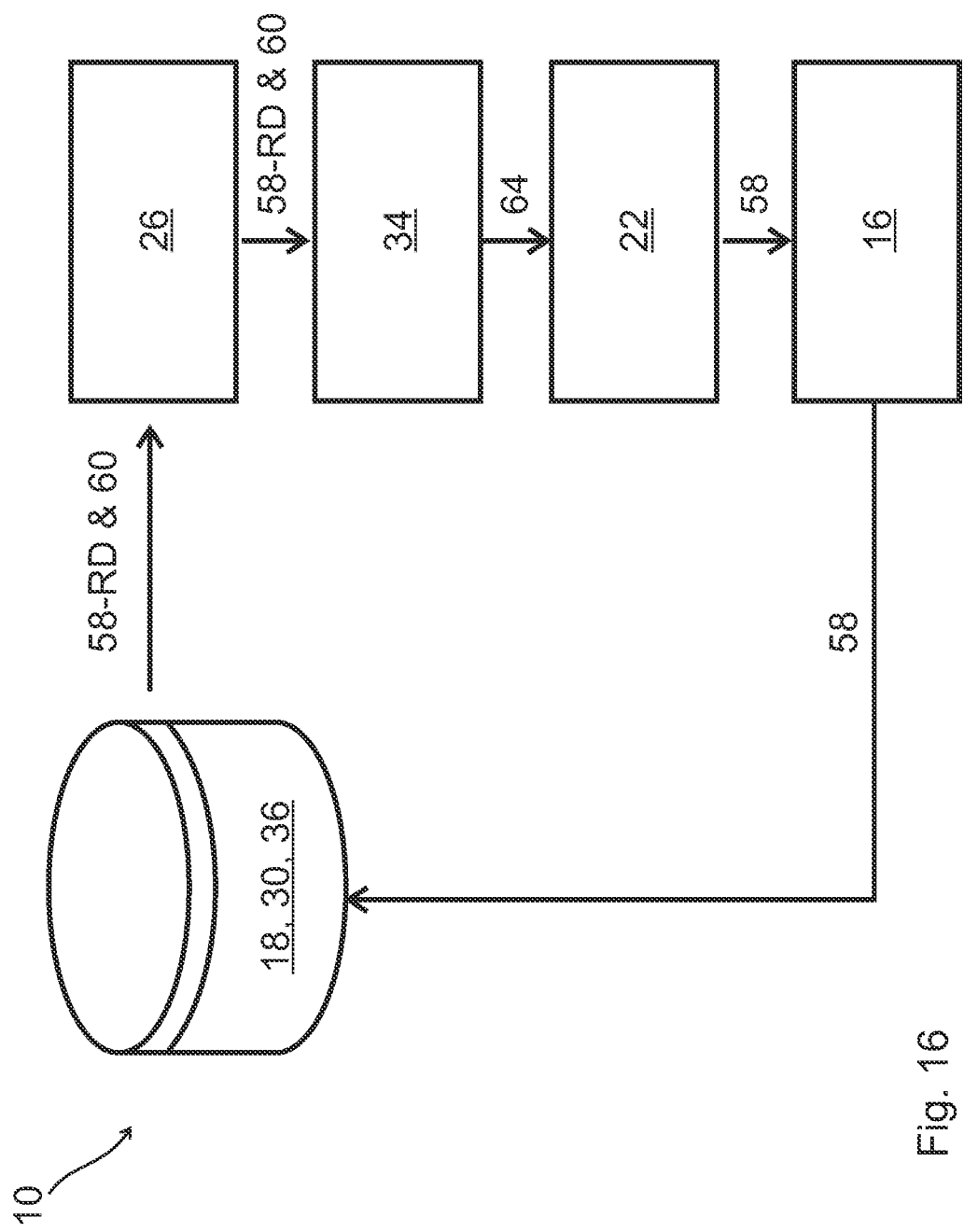
FIG. 16 is a schematic representation of an example of an electromobility charge testing system in accordance with the invention.

FIGS. 15 and 16 show schematically further embodiments of an electromobility charge testing system 10 that can work with the electromobility charge testing system 10 in FIG. 14. According to FIG. 15 measurement data 58, according to FIG. 16 charging models 60 and/or measurement data 58, in particular reaction data, can be transferred from the server device 18 via a network connection sub-device 26 to an emulation sub-device 34 of an emulation device 32, via which the corresponding actions and reactions are transmitted by the interface sub-device 22 to the test object. Whereas according to the embodiment in FIG. 15 the measurement data 58 is initially converted by a modeling sub-device 30 into a charging model 60, according to the embodiment in FIG. 16 a direct playback of the reaction data RD of the measurement data 58 or alternatively an emulation of the charging model 60 by the emulation device 34 can take place. The emulation device 34 generates emulation data 64 that can be output via the interface sub-device 22 to the connected electric vehicle 50 or charging station 52. With a recording sub-device 16 of a measuring device 12, measurement data 58 of the object to be tested can be recorded and filed in turn in the server device 18. Furthermore, a subdividing sub-device 36 for subdividing the measurement data 58 into action data and reaction data AD, RD and a modeling sub-device 30 for central creation of a charging model 60 can be provided in the server device 18. The action and reaction behaviors of the charging operation of a test object can thus be analyzed by playing back action or reaction data and recording the respective action or reactions. The action or reaction data can be based on measurement data 58 or be obtained from charging models 60.

Figure 17:
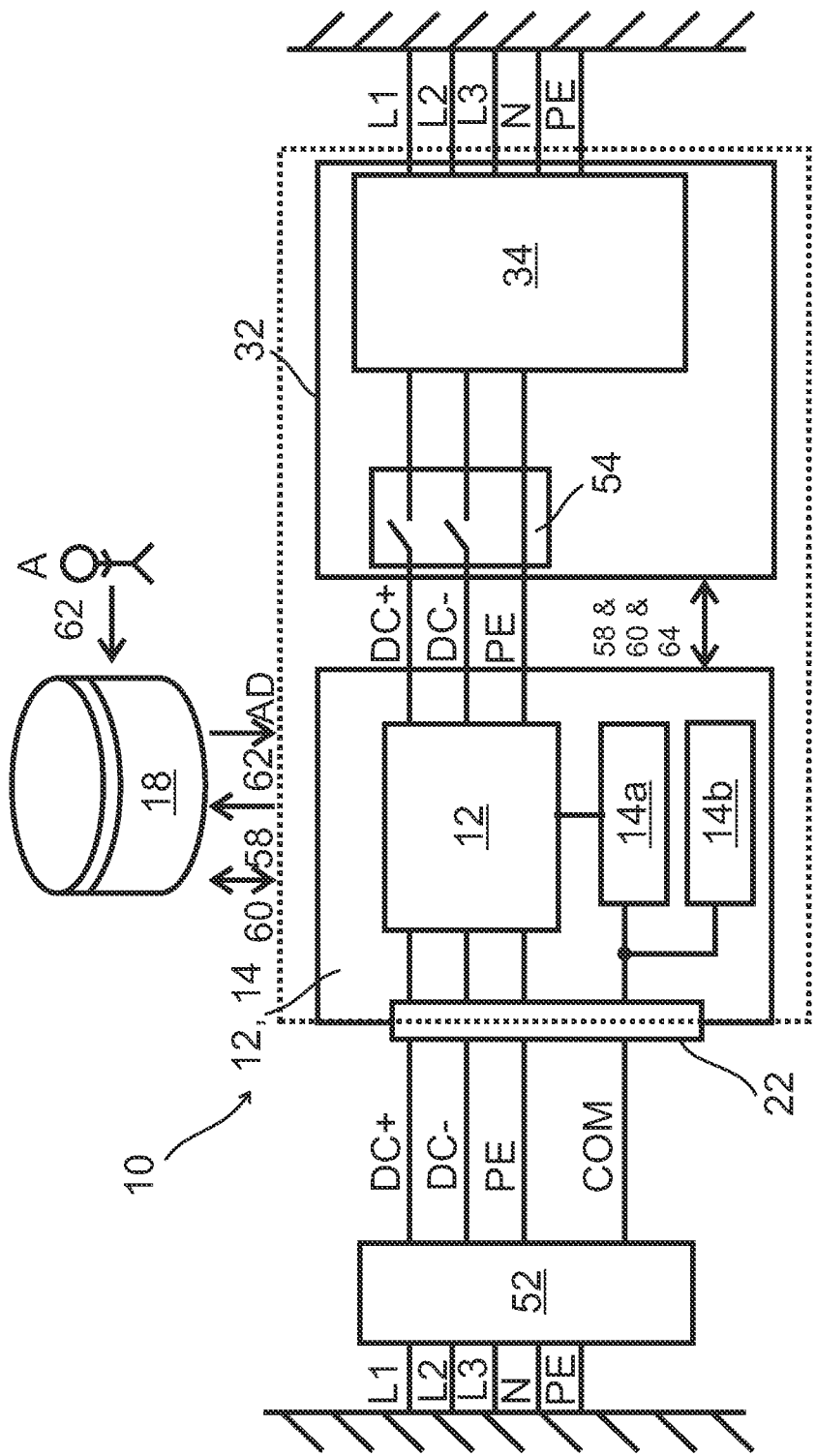
FIG. 17 is a schematic representation of a measuring and modeling operation by means of an example of an electromobility charge testing system in accordance with the invention.
Figure 18:
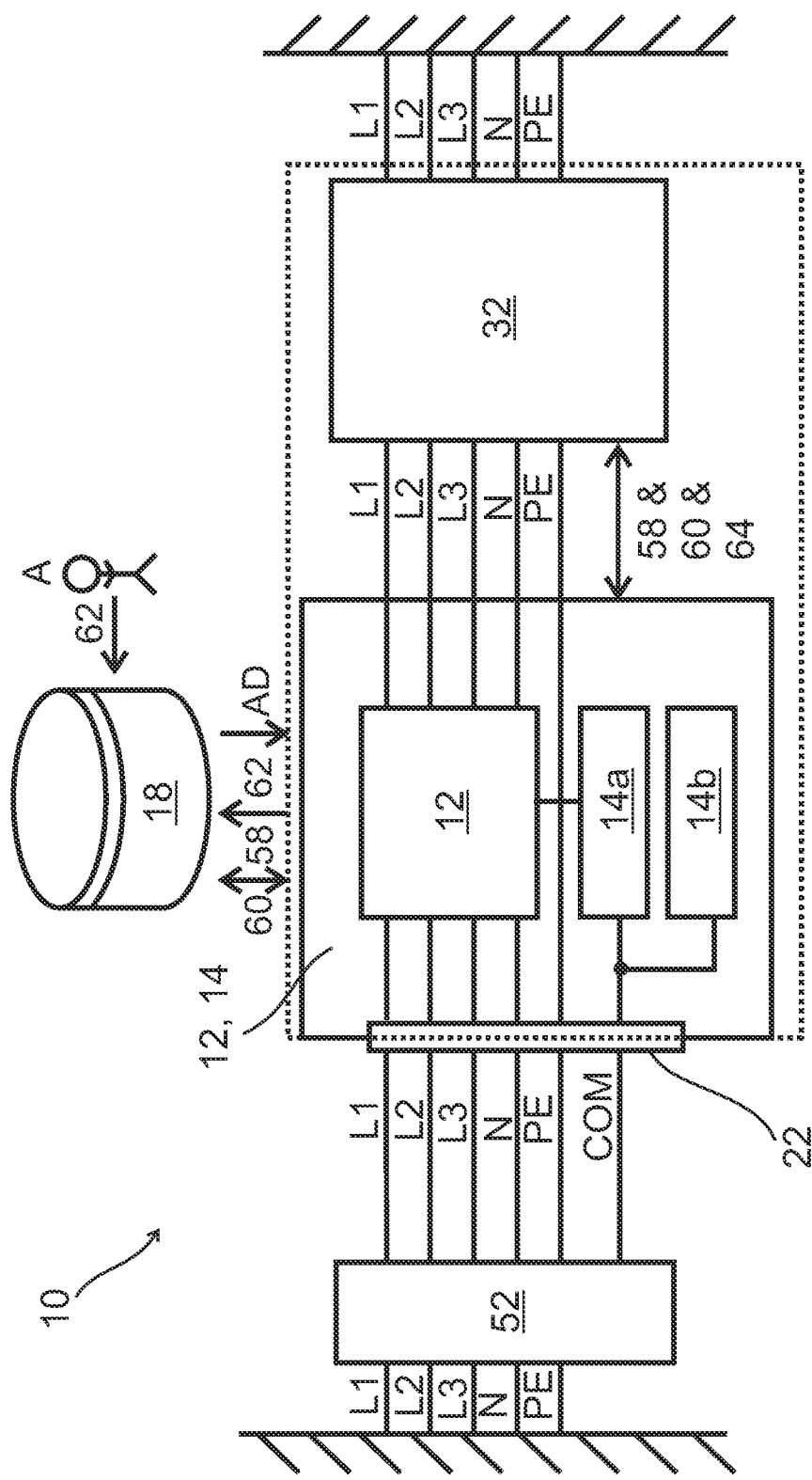
FIG. 18 is a schematic representation of a measuring and modeling operation by means of an example of an electromobility charge testing system in accordance with the invention.

FIGS. 17 and 18 show embodiments of electromobility charge testing systems 10 which are configured in particular for analysis of charging stations 52.

FIG. 17 shows a further embodiment of an electromobility charge testing system 10 for testing charging operations of a DC emulation device 32 or of a DC electric vehicle 50 and DC charging station 52, illustrating the power connections. The DC emulation device 32 is used for emulating a selectable DC electric vehicle 50. By selecting a charging model 60 or measurement data 58 corresponding to an electric vehicle type, the interoperability of this type with the charging station 52 can be tested. To do so, a mains three-phase AC current L1, L2, L3, N, PE is converted into a DC voltage by means of the DC charging station 52, wherein the DC charging station 52 is connected to a measuring device 12 or modeling device 14 via an interface sub-device 22 with corresponding charging plug. The modeling device 14 comprises two modeling sub-devices 14*a*, 14*b* designed for generation of charging models 60 for current/voltage measurement of the power connection DC+, DC− and of protocol information and metadata 62 of the data signals COM, referred to as measurement data 58. The generated charging models 60 can be uploaded/downloaded via a network connection sub-device, not shown, to a server device 18, for example an internet server. The measuring device 12 and the modeling device 14 can be electrically disconnected from the emulation sub-device 34 by a switching device 54 of the DC emulation device 32. The emulation sub-device 34 emulates, on the basis of the charging model 60 or playable measurement data 58, the charging behavior of a preselected electric vehicle 50, and to do so outputs emulation data 64 as current/voltage values or receives these, and can where applicable also emit data signals. In this example, the data signals COM are output by the modeling sub-device 14*a*. This allows charging operations of the DC emulation device 32, in particular of the DC electric vehicle 50, and the DC charging station 52 to be measured, recorded and simulated in a charging model. Furthermore, a user A can upload metadata 62 of the DC electric vehicle 50 and/or DC charging station 52 to the server device 18, manually or semiautomatically, to specify the charging operation in more detail. Furthermore, electrically recordable metadata 62 of the charging station 52 can be automatically recorded and uploaded via the measuring device 12.

In comparison with FIG. 17, FIG. 18 shows a further embodiment of an electromobility charge testing system 10 for testing of charging operations of an AC emulation device 32 or of an AC electric vehicle 50 and an AC charging station 52. This is substantially identical to the design in the example according to FIG. 17, wherein a charging operation on an AC or three-phase AC basis takes place, and corresponding rectifiers are provided in the electric vehicle 50 emulated by the charge testing system 10. This example also differs from the example shown in FIG. 17 in that the AC emulation device 32 or the AC electric vehicle 50 is connected directly to the measuring device 12 and modeling device 14 without the arrangement of a switching device 54.

Figure 19:
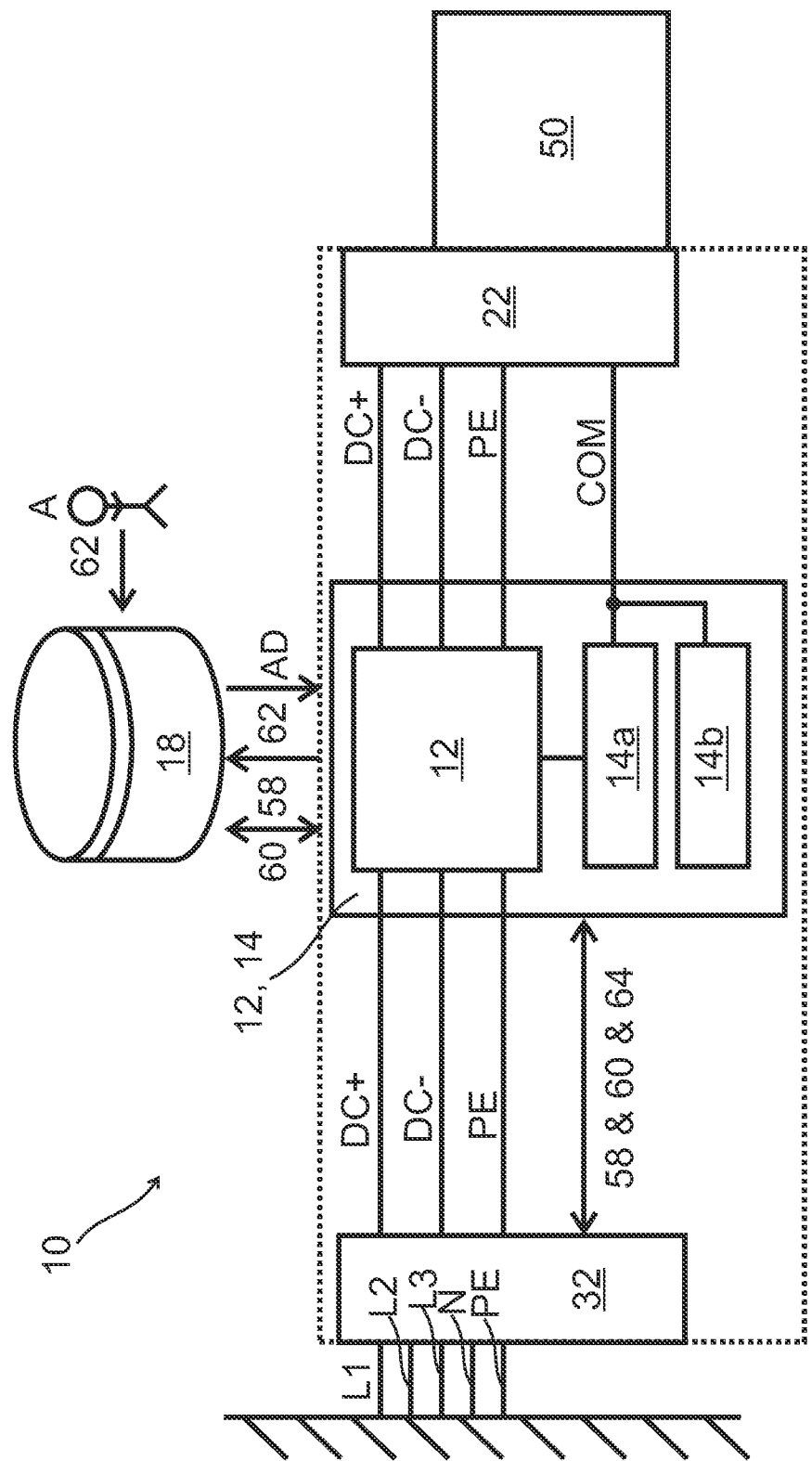
FIG. 19 is a schematic representation of a measuring and modeling operation by means of an example of an electromobility charge testing system in accordance with the invention.
Figure 20:
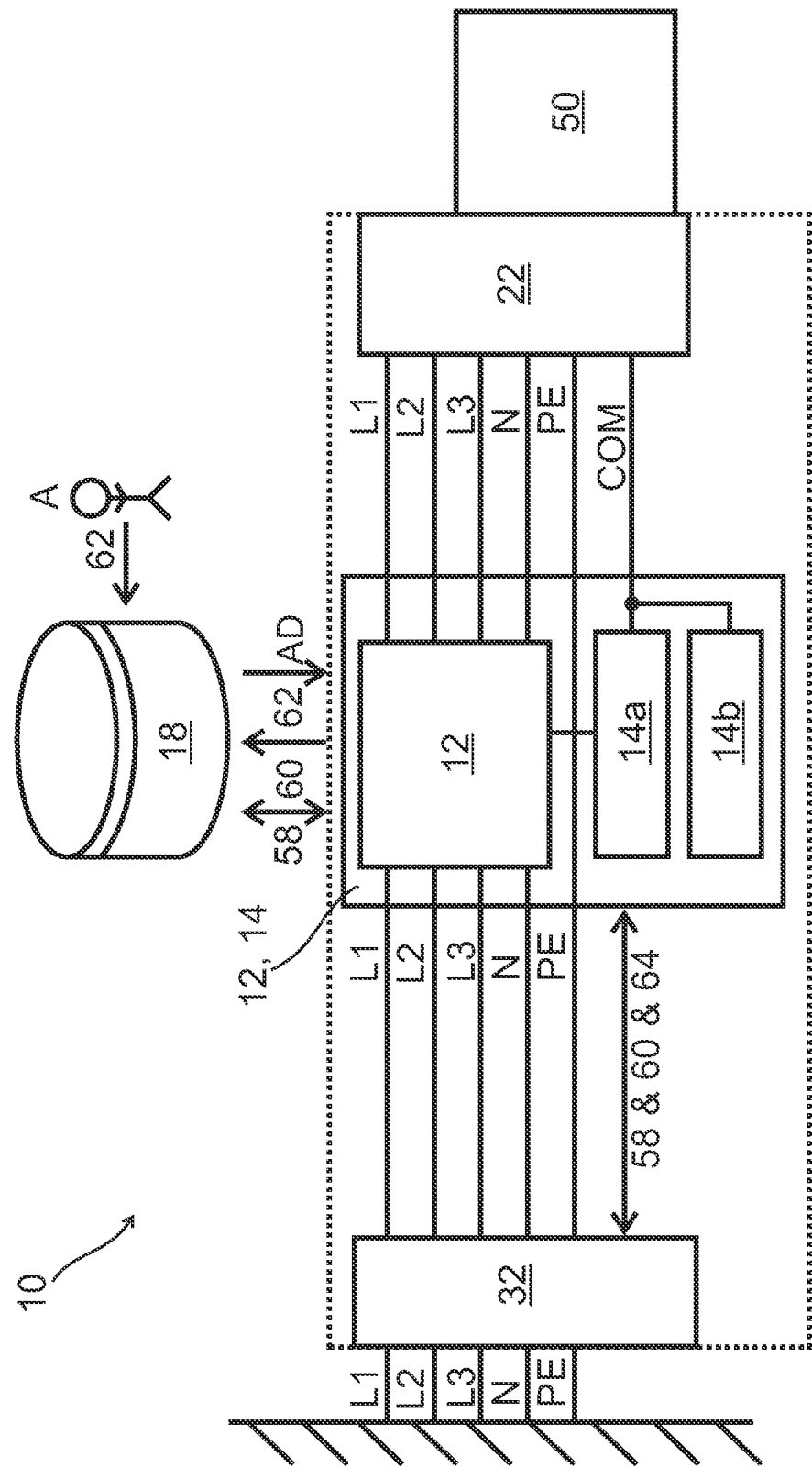
FIG. 20 is a schematic representation of a measuring and modeling operation by means of an example of an electromobility charge testing system in accordance with the invention.
Figure 21:
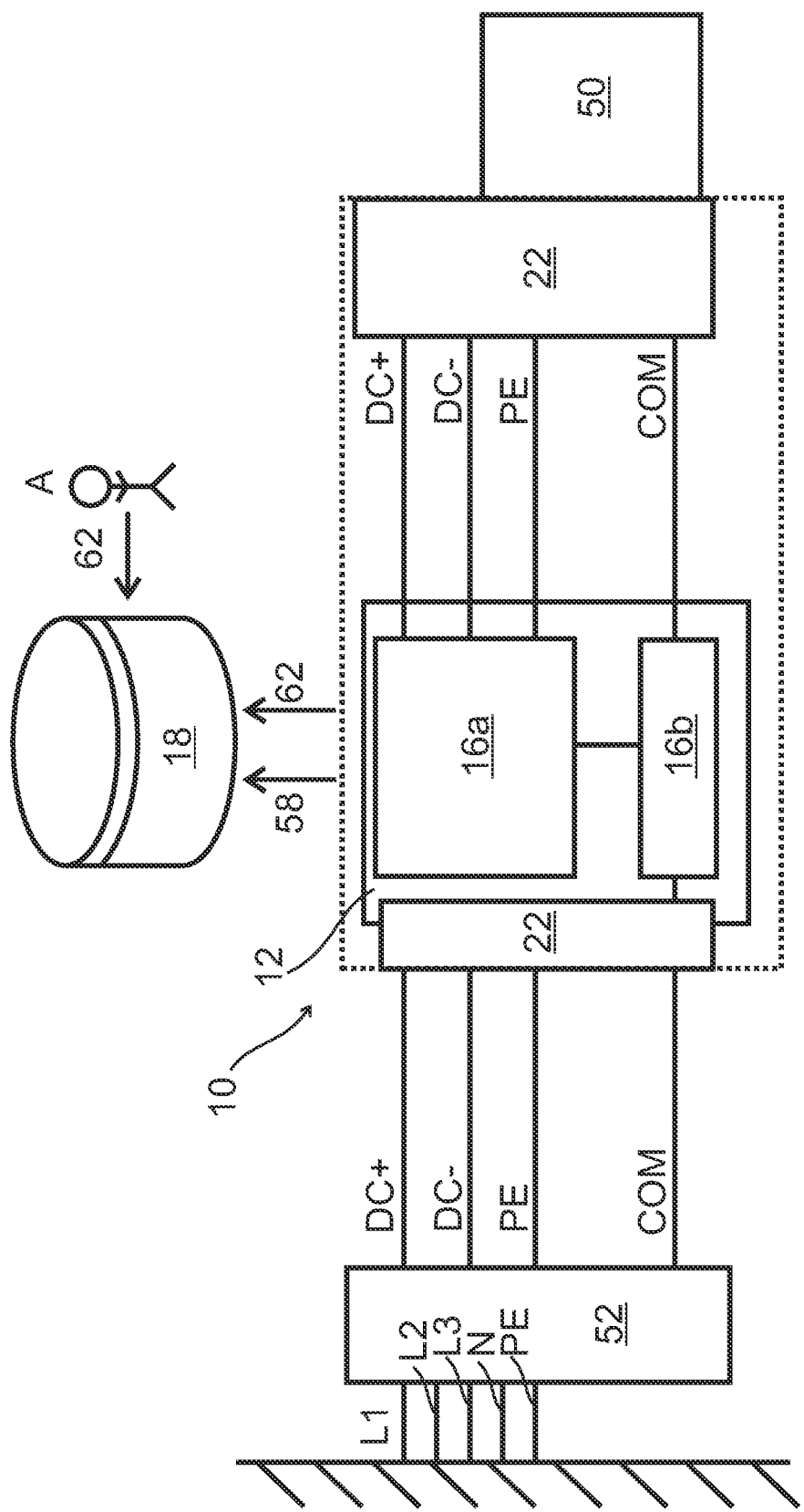
FIG. 21 is a schematic representation of a measuring and modeling operation by means of an example of an electromobility charge testing system in accordance with the invention.

FIGS. 19 to 21 show further embodiments of electromobility charge testing systems 10 which are configured in particular for analysis of an electric vehicle 50.

FIG. 19 shows an embodiment of an electromobility charge testing system 10 for emulating a selectable DC charging station 52 or the connection of a mains grid to a DC electric vehicle 50 to be tested. This allows the interoperability of the electric vehicle 50 to be tested with a plurality of types of charging stations 52. The general design of this example is substantially identical to the design of the example according to FIG. 17. According to the embodiment shown in FIG. 19, the electric vehicle 50 is electrically connected to a measuring device 12 and modeling device 14 via an interface sub-device 22 integrated in the plug connection. Diverging from what is shown for example in FIG. 17, a DC emulation device 32 is used for emulating a specifiable DC charging station 52, alternatively a DC charging station 52 can for example be connected for logging the measurement data. The type of charging station 52 to be emulated can be selected using a charging model 60 downloadable from the server device 18 or using playable measurement data 58, and the corresponding energy flows DC+, DC− provided by the emulation device 32. Communication data COM can be recorded and output via the modeling sub-devices 14a, 14b.

In comparison with FIG. 19, FIG. 20 shows a further embodiment of an electromobility charge testing system 10 for testing the charging operations of an AC emulation device 32 or an AC charging station 52 and AC electric vehicle 50. The design and function of this embodiment is otherwise identical to the DC design of the embodiment in FIG. 19.

FIG. 21 shows a further embodiment of a DC electromobility charge testing system 10 for testing of charging operations of a DC charging station 52 and DC electric vehicle 50. This embodiment is particularly suitable for recording measurement data 58, metadata 62, and for generating charging models 60 of charging stations 52 and electric vehicles 50. A measuring device 12 is arranged in the charging cable for measuring charging operations between DC charging station 52 and DC electric vehicle 50, wherein the measuring device 12 comprises two recording units 16a, 16b. The measurement data 58 recorded by the recording unit 16a for measurement of the power currents and by the recording unit 16b for measurement of communication data COM, and where applicable generated metadata 62, is stored by uploading it to a server device 18. A user A can also upload metadata 62 of the DC electric vehicle 50 and DC charging station 52 to the server device 18 manually or semiautomatically, e.g. by scanning a barcode or QR code characterizing the vehicle 50 or charging station 52. For coupling to the charging station 52 and to the electric vehicle 50, an interface sub-device 22 is provided in each case.

Figure 22:
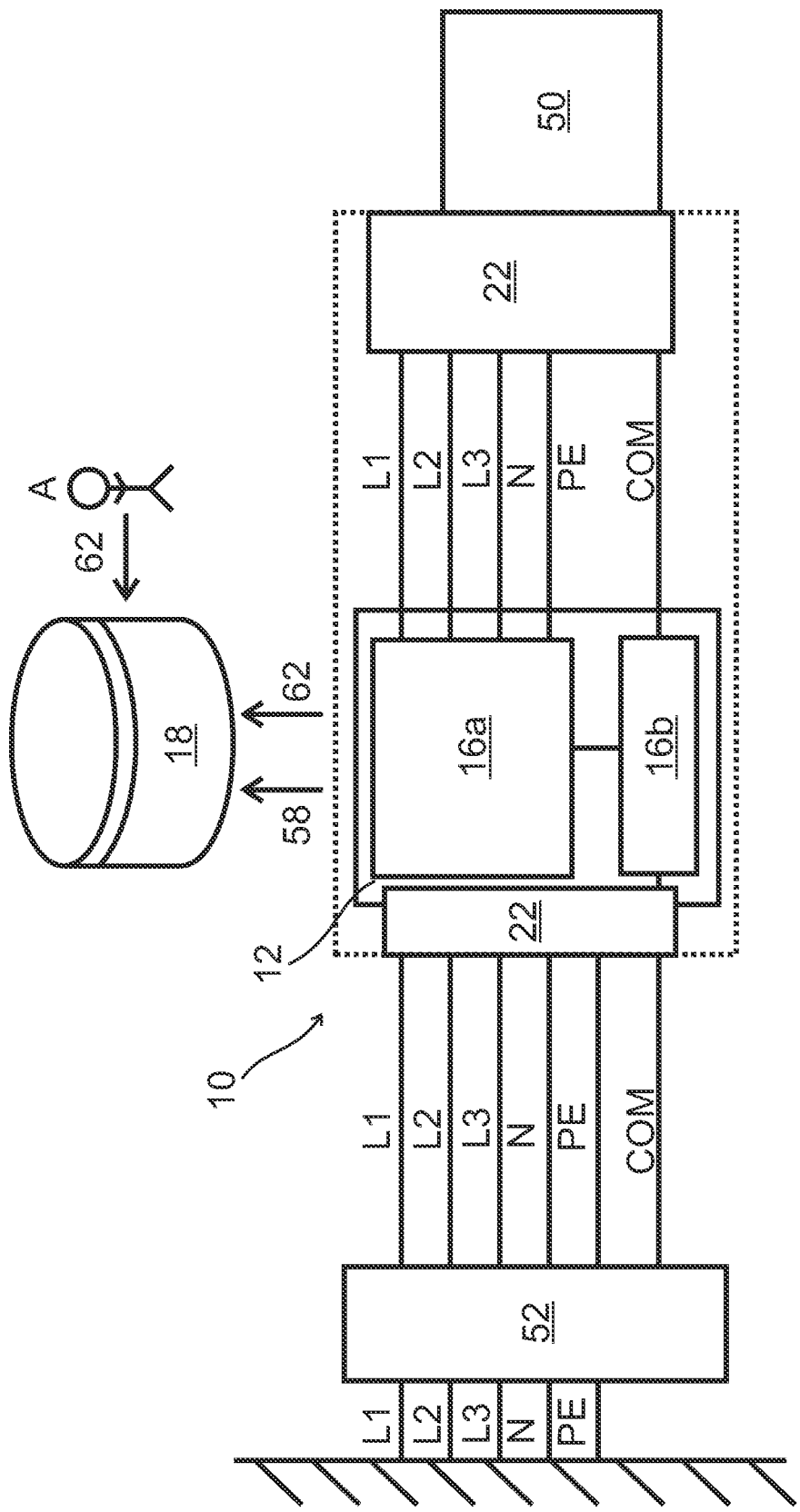
FIG. 22 is a schematic representation of a measuring and modeling operation by means of an example of an electromobility charge testing system in accordance with the invention.

In comparison with FIG. 21, FIG. 22 shows a further embodiment of an electromobility charge testing system 10 for testing alternating-current charging operations of an AC charging station 52 and an AC electric vehicle 50 on a three-phase AC basis, wherein the further design of the electromobility charge testing system 10 is identical to the design of the DC examples according to FIG. 21.

Figure 23:
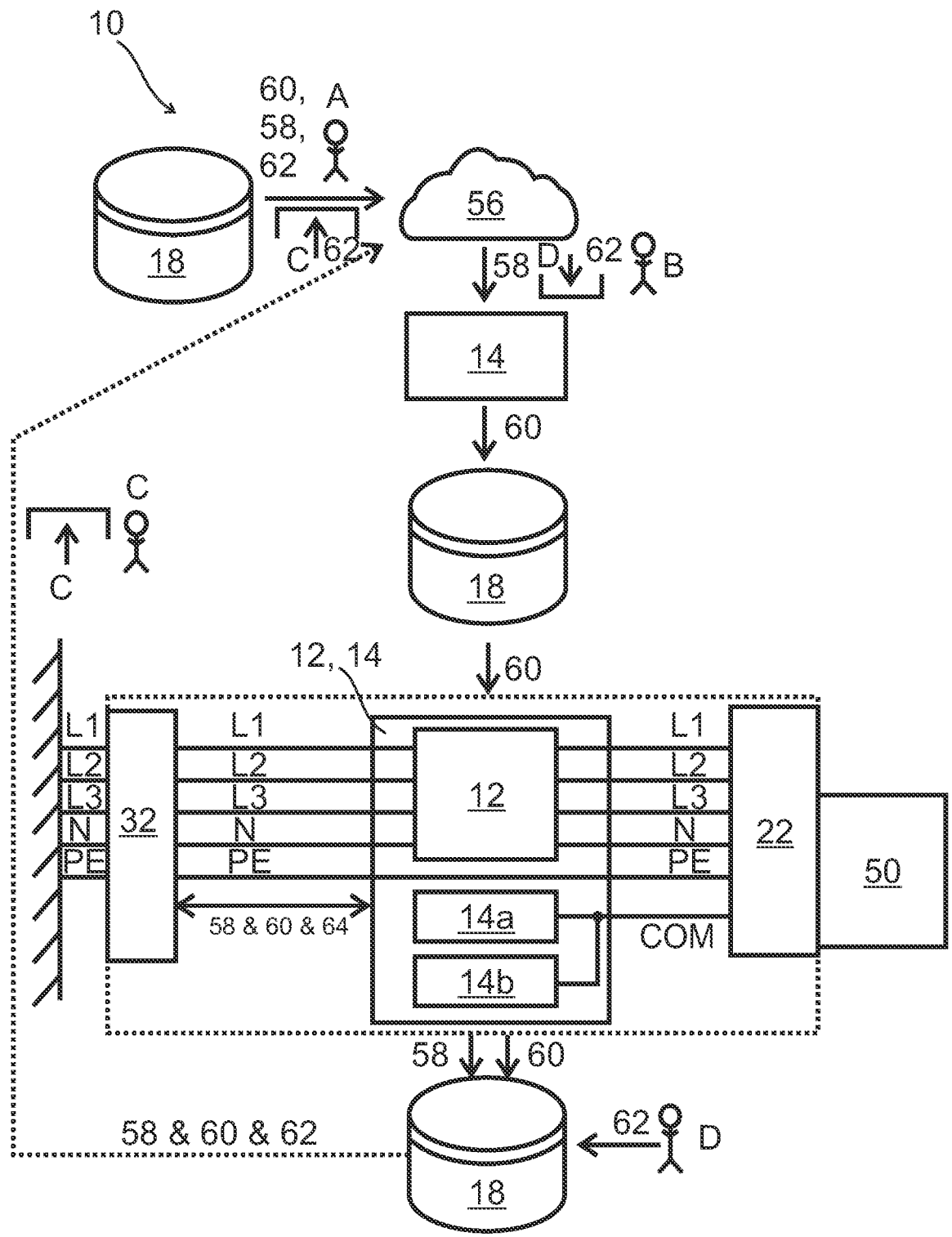
FIG. 23 is a schematic representation of an example of an electromobility charge testing system in accordance with the invention with an AC electric vehicle.
Figure 24:
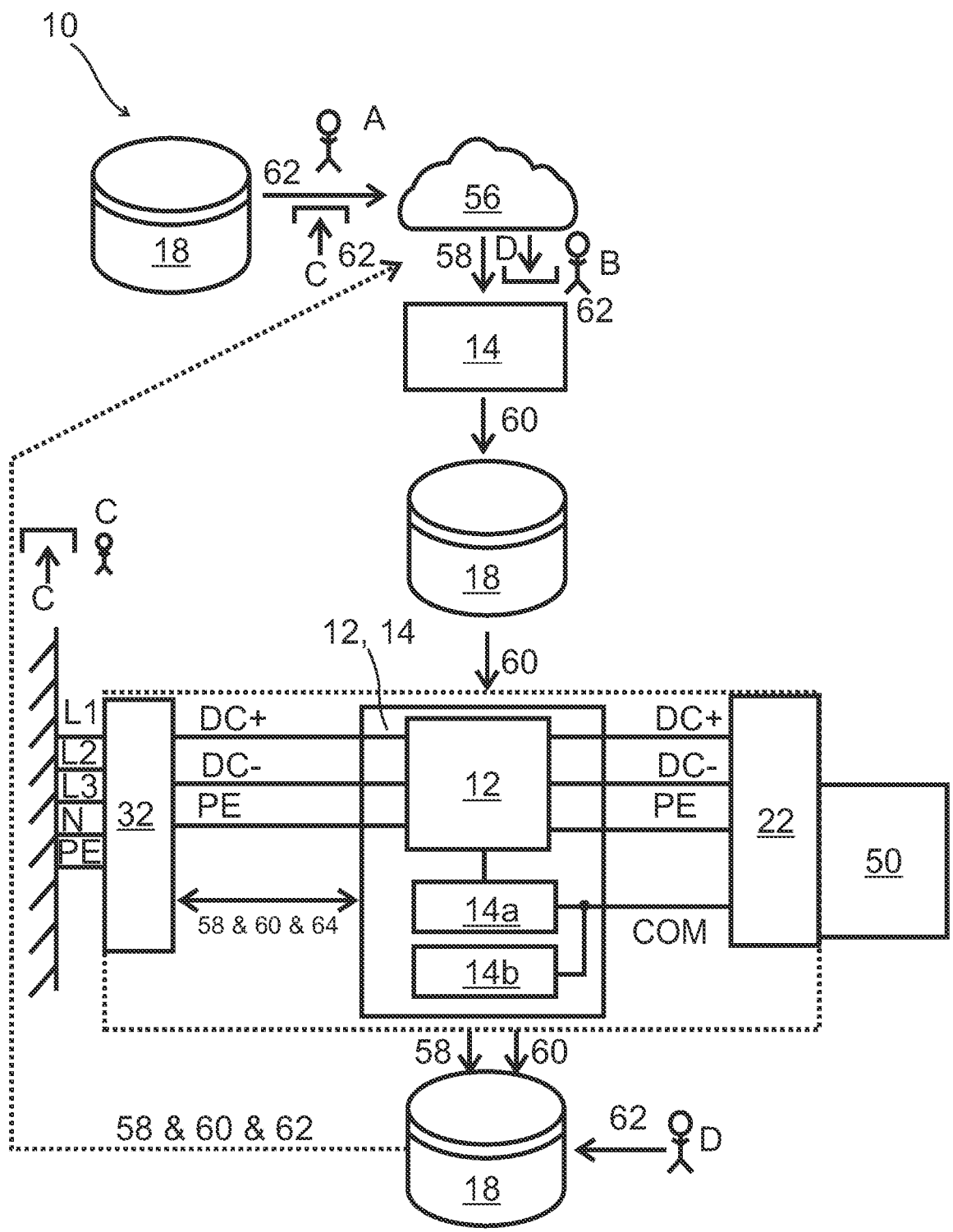
FIG. 24 is a schematic representation of the example shown in FIG. 22 of an electromobility charge testing system in accordance with the invention with a DC electric vehicle.

FIGS. 23 and 24 show two embodiments for testing of an AC or DC charging operation for a specific electric vehicle 50 in which the charge testing system emulates a selectable charging station 52.

According to FIG. 23, a user A can, in an embodiment of an AC charge testing system 10, upload measurement data 58 and/or a charging model 60 of charging operations of an electric vehicle previously tested by the user C and metadata 62 to an online exchange platform 56 designed as a server device 18. The data of charging models 60 or measurement data 58 stored on the online exchange platform 56 can be downloaded by a user B. If measurement data 58 is downloaded, a charging model 60 can be optionally created therefrom by an external modeling device 14, arranged for example in the online exchange platform 56. Furthermore, modeling sub-devices 14a, 14b can also be provided in the charge testing system 10, in addition to the measuring device 12, and can create a charging model 60 of the electric vehicle to be tested 50 on the basis of the measurement data 58 and metadata 62 recorded during the emulation operation. The two modeling sub-devices 14a, 14b of the modeling device 14 can thus generate a charging model 60. The charging model generated and/or the measurement data 58, and where applicable also generated metadata 62, can be filed locally on a server device 18. They can be uploaded by a user D, where applicable supplemented with further metadata 62, to the online exchange platform 56. The charging models 60, measurement data 58 and metadata 62 stored on the server device 18 of the online exchange platform 56 can be tested centrally by a user A and supplemented with further metadata 62.

A charging model 60 stored on the server device 18 or playable measurement data 58 can be selected by the user B for emulating a specifiable AC charging station 52 designed as an AC emulation device 32, in order to permit testing of the interoperability of a plurality of charging station types 52 using the connected AC electric vehicle 50. The AC emulation device 32 is connected directly, and the AC electric vehicle 50 via an interface sub-device 22, to the measuring device 12 and modeling device 14. Using the measuring device 12 and modeling device 14, it is possible to both construct a charging model 60 of the charging operations with the measurement data and to record playable measurement data 58. The measurement data 58 and the charging model 60 of the electric vehicle 50 and charging station 52, to be tested by the user D, and further metadata 62 can be uploaded by the user C to a server device 18.

The embodiment according to FIG. 24 is substantially comparable with the design of the example according to FIG. 23. However, this example differs from the DC example shown in FIG. 23 in that a DC emulation device 32 or a DC charging station 52 and DC electric vehicle 50 are used by the user D instead of the AC emulation device 32 or the AC charging station 52 and AC electric vehicle 50.

Figure 25:
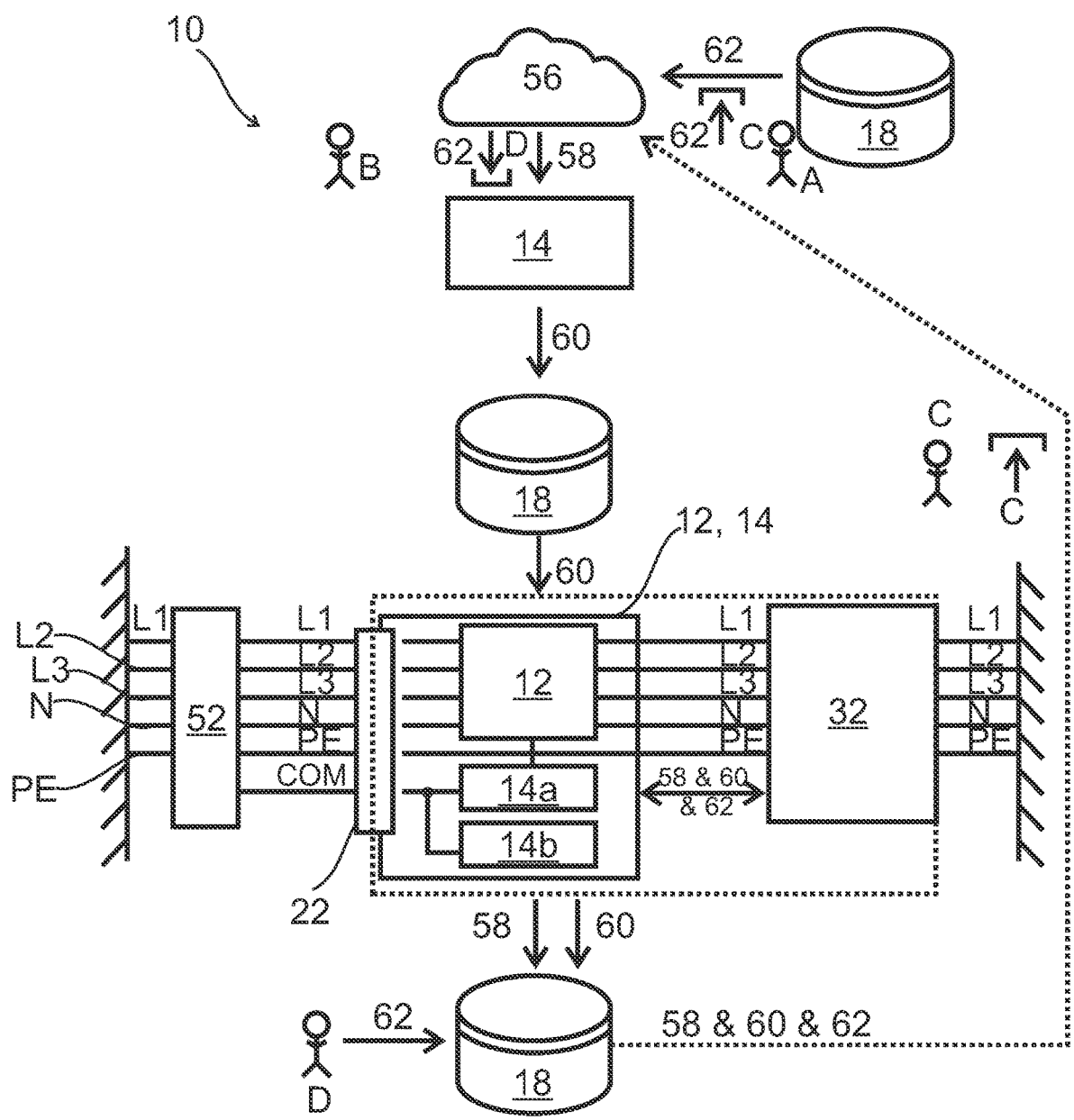
FIG. 25 is a schematic representation of an example of an electromobility charge testing system in accordance with the invention, with an AC-charging station.
Figure 26:
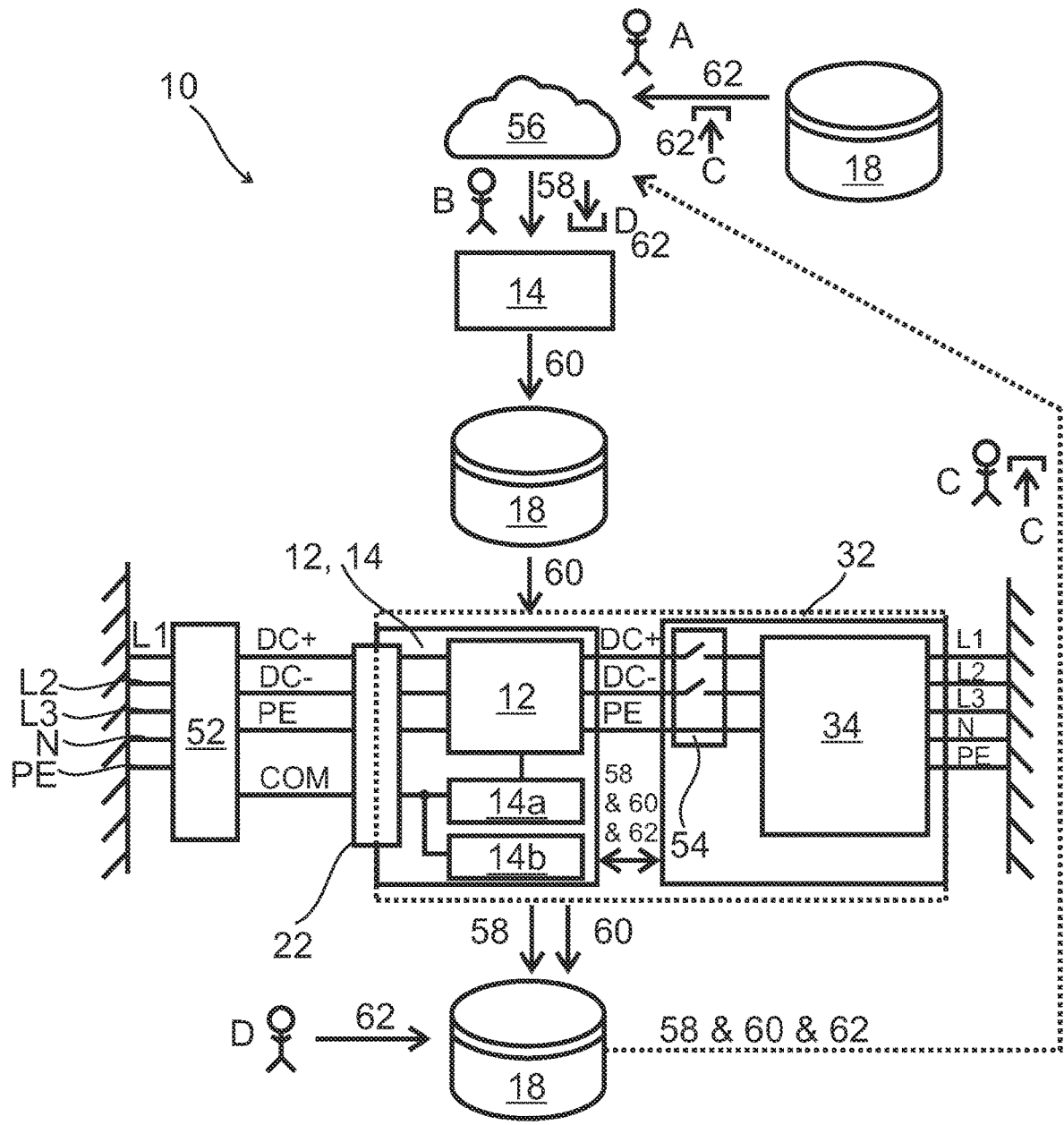
FIG. 26 is a schematic representation of an example of an electromobility charge testing system in accordance with the invention with a DC charging station.

The embodiments of a charge testing system 10 according to FIG. 25 and FIG. 26 are substantially identical to the embodiments according to FIGS. 23 and 24, but are used for testing not of an electric vehicle 50 but of a specific charging station 52.

FIG. 25 shows in this connection an AC charging operation, and FIG. 26 a DC charging operation. Compared to the embodiment shown in FIG. 23, in FIG. 25 the AC charging station 52 is connected via an interface sub-device 22 to the measuring device 12 and modeling device 14, while a selectable electric vehicle 50 is emulated by the emulation device 32.

By contrast, the embodiment shown in FIG. 26 differs from the embodiment shown in FIG. 24 in that the DC charging station 52 is connected via an interface sub-device 22 to the measuring device 12 and modeling device 14. A DC electric vehicle 50 selectable by measurement data 58 or charging model 60 is emulated by a DC emulation device 32 comprising a switching device 54.

List of Reference Numerals

10 Electromobility charge testing system
12 Measuring device
14 Modeling device
14a, 14b Modeling sub-device
16 Recording sub-device
16a, 16b Recording unit
18 Server device/database/data memory
20 Subdividing device
22 Interface sub-device
24 Storage sub-device
26 Network connection sub-device/data interface
28 Processing sub-device
30 Modeling sub-device
32 Emulation device, DC emulation device
34 Emulation sub-device
36 Subdividing sub-device
38 Selection sub-device
40 Measuring operation
42 Emulation operation
44 Modeling operation
46 Subdividing operation
48 Access check sub-device
50 Electric vehicle, DC electric vehicle, AC electric vehicle
52 Charging station, DC charging station, AC charging station
54 Switching device
56 Online exchange platform
58 Measurement data
60 Charging model
62 Metadata
64 Emulation data
66 Analysis sub-device
68 Simulation sub-device
COM Communication data
AD Action data
RD Reaction data
A User A
B User B
T1 Type 1
T2 Type 2
T3 Type 3
C Uploading
D Downloading

The invention claimed is:

1. An electromobility charge testing system for generating and exchanging measurement data or a charging model of electric behaviors, in particular voltage and/or current behaviors, protocol parameters and communication contents of a charging operation of an electric vehicle and/or charging station, wherein the charging operation consists of an action of the electric vehicle and a reaction of the charging station, and for testing the communication capability and/or chargeability of the electric vehicle and/or charging station, comprising:
at least one measuring device for providing the measurement data of the electrical behaviors, protocol parameters and/or communication contents of the charging operation of the electric vehicle and/or charging station (52),
wherein the electromobility charge testing system is configured to subdivide the measurement data into action data loggable during the charging operation in accordance with the action of the electric vehicle and reaction data of the charging station adapting to the action, and
the electromobility charge testing system further comprises:
at least one modeling device for creating a charging model of the charging operation, configured to automatically generate the charging model for action and reaction on the basis of the measurement data logged by the measuring device, whereby charging models are generatable by the electric vehicle or the charging station,
at least one server device for storage and provision of an exchange possibility for the measurement data or charging model, such that the measurement data or the charging model is uploadable directly or via a network to the server device and/or downloadable from the server device, and
at least one emulation device for downloading the measurement data or the charging model from the measuring device or from the modeling device or from the server device and for emulating the action of the charging operation of the electric vehicle and/or the reaction of the charging operation of the charging station by playing back the measurement data subdivided into action data and reaction data or the correspondingly generated charging model.

2. The electromobility charge testing system according to claim 1, wherein the measuring device comprises an interface sub-device for connection to an electric vehicle and/or charging station, a recording sub-device and a network connection sub-device, wherein the measurement data is recordable via the interface sub-device by means of the recording sub-device, and is uploadable by the network connection sub-device to the server device and/or transferable to the modeling device.

3. The electromobility charge testing system according to claim 2, wherein the network connection sub-device is designed as a cable-connected data interface, in particular as a CAN interface, Ethernet, LIN, RS232, GPIB, SRI, I2C, MOST-Bus, FlexRay, Profibus, CANopen, SERCOS, or as a wireless network connection sub-device, in particular a LAN, mobile radio, WLAN or NFC/RFID network connection sub-device, such that the measurement data is transferable via the network connection sub-device within the electromobility charge testing system and/or onto the server device and/or to the modeling device.

4. The electromobility charge testing system according to claim 1, wherein the modeling device comprises:
at least one network connection sub-device, preferably a wireless network connection sub-device, in particular a radio, WLAN or NFC network connection sub-device, for reading out the measurement data from the measuring device and/or from the server device;

at least one modeling sub-device for modeling the measurement data of the charging operation, in particular two modeling sub-devices for modeling the measurement data of the electric vehicle and/or charging station;

at least one processing sub-device for processing the measurement data into a data format adapted to the charging model; and at least one network connection sub-device for uploading the charging model to the server device and/or downloading measurement data from the server device and/or for transmission to the at least one emulation device.

5. The electromobility charge testing system according to claim 4, further comrpising a subdividing device which is configured to subdivide measurement data according to a predefined behavior of the electric vehicle and/or charging station, in particular into action data and reaction data.

6. The electromobility charge testing system according to claim 5, wherein the subdividing device comprises at least one network connection sub-device for reading out and/or transferring or downloading and/or uploading of the measurement data from the measuring device and/or modeling device and/or server device, and at least one subdividing sub-device for performing a predefinable data subdivision.

7. The electromobility charge testing system according to claim 5, wherein the subdividing sub-device is comprised in the modeling device in order to permit use of the action data and reaction data in different ways.

8. The electromobility charge testing system according to claim 4, wherein at least one analysis sub-device and/or one simulation sub-device are comprised in the modeling device, wherein the analysis and/or simulation sub-device are configured to analyze the measurement data subdivided into action data and reaction data and to simulate the electrical behaviors, protocol parameters and communication contents of the charging operation of the electric vehicle and/or charging station.

9. The electromobility charge testing system according to claim 1, wherein the at least one emulation device comprises at least one network connection sub-device for downloading the measurement data and/or charging model and at least one emulation sub-device, wherein the recorded or simulated electrical behaviors, protocol parameters and communication contents of the charging operation of the electric vehicle and/or charging station are imitable or emulatable by the emulation sub-device.

10. The electromobility charge testing system according to claim 9, wherein the at least one emulation sub-device comprises a selection sub-device configured to subdivide the measurement data and/or the data of the charging model downloaded from the server device, in particular into action and reaction data, whereby prior to the emulation an adapted electrical behavior, protocol parameters and communication contents are providable manually, automatically or semiautomatically for a realistic simulation of the electric vehicle and/or charging station.

11. The electromobility charge testing system according to claim 1, wherein the measuring device and the modeling device are structurally enclosed in a housing.

12. The electromobility charge testing system according to claim 1, wherein the modeling device and the at least one emulation device are structurally enclosed in a housing.

13. The electromobility charge testing system according to claim 1, wherein the server device is designed at least partially as a cloud-based internet server, wherein any access to the server device is preferably controllable by an access check sub-device.

14. The electromobility charge testing system according to claim 1, wherein the modeling device is arranged in the server device.

15. The electromobility charge testing system according to claim 1, wherein a subdividing device is arranged in the server device and is configured to subdivide the measurement data according to a predefined behavior of the electric vehicle and/or charging station, in particular into action data and reaction data.

16. The electromobility charge testing system according to claim 1, wherein the measurement data and/or the charging model comprises metadata on the electric vehicle and/or charging station which is logged by the measuring device during measurement between the charging station and the electric vehicle, in particular equipment manufacturer, equipment type, date of manufacture, serial number, software version, recording date, equipment image, rating plate, equipment location, battery capacity and/or battery internal resistance, and information on the measuring device such as equipment type, firmware version, equipment manufacturer, hardware version, and/or software scope.

17. An electromobility charge testing method for generating and exchanging measurement data and/or a charging model of electric behaviors, in particular voltage and/or current behaviors, protocol parameters and communication contents of a charging operation of an electric vehicle and/or charging station, wherein the charging operation consists of an action of the electric vehicle and a reaction of the charging station, and for testing the communication capability of the electric vehicle and/or charging station by an electromobility charge testing system according to claim 1, comprising the steps:

measuring the electrical behaviors, protocol parameters and communication contents of the charging operation of the electric vehicle and/or charging station by the measuring device wherein the measurement data is subdivided into action data logged during the charging operation in accordance with the action of the electric vehicle and reaction data of the charging station adapting to the action, and the electromobility charge testing method further comprises the steps:

automatically generating a charging model (60) of the charging operation for the action data and reaction data by the modeling device (14), based on the logged measurement data, whereby the charging model is generated by the electric vehicle or the charging station;

uploading via a network or directly transferring the measurement data or charging model to the server device;

downloading the measurement data and/or charging model by means of the at least one emulation device via the network or direct reception from the modeling device and/or measuring device;

emulating the action or reaction of the charging operation by the emulation device by playing back the selected measurement data subdivided into action data and reaction data or the correspondingly generated charging model to the at least one emulation device.

18. The method according to claim 17, wherein the measurement data and/or the charging model are emulated on the at least one emulation device manually, automatically or semiautomatically.

19. The method according to claim 17, wherein before the measurement data is uploaded to the server device it can be subdivided by means of a subdividing device, in particular a subdividing sub-device, according to a predefined behavior of the electric vehicle and and/or charging station, in particular into action data and reaction data.

20. The method according to claim 17, wherein before the measurement data is uploaded to the server device it can be analyzed by means of an analysis sub-device and the electrical behaviors, protocol parameters and communication contents of the charging operation of the electric vehicle and/or charging station can be simulated by means of a simulation sub-device of the modeling device.

21. The method according to claim 17, wherein any access to the server device can be controlled via an access check sub-device.

* * * * *